United States Patent
Tanaka

(10) Patent No.: US 10,996,237 B2
(45) Date of Patent: May 4, 2021

(54) PHYSICAL QUANTITY SENSOR, METHOD FOR MANUFACTURING PHYSICAL QUANTITY SENSOR, COMPLEX SENSOR, INERTIA MEASUREMENT UNIT, PORTABLE ELECTRONIC APPARATUS, ELECTRONIC APPARATUS, AND VEHICLE

(71) Applicant: Seiko Epson Corporation, Tokyo (JP)

(72) Inventor: Satoru Tanaka, Chino (JP)

(73) Assignee: Seiko Epson Corporation

(*) Notice: Subject to any disclaimer, the term of this patent is extended or adjusted under 35 U.S.C. 154(b) by 160 days.

(21) Appl. No.: 16/115,629

(22) Filed: Aug. 29, 2018

(65) Prior Publication Data
US 2019/0064201 A1  Feb. 28, 2019

(30) Foreign Application Priority Data

Aug. 30, 2017 (JP) .............................. JP2017-165161

(51) Int. Cl.
*G01P 15/08* (2006.01)
*G01P 15/125* (2006.01)
*B81B 5/00* (2006.01)
*G01C 19/5628* (2012.01)
*B81B 3/00* (2006.01)

(52) U.S. Cl.
CPC ........ *G01P 15/0802* (2013.01); *B81B 3/0018* (2013.01); *B81B 5/00* (2013.01); *G01C 19/5628* (2013.01); *G01P 15/125* (2013.01); *B81B 2201/0235* (2013.01); *B81B 2203/04* (2013.01); *G01P 2015/0831* (2013.01); *G01P 2015/0871* (2013.01)

(58) Field of Classification Search
CPC ............... G01P 15/0802; G01P 15/125; G01P 2015/0831; G01P 2015/0871; B81B 5/00; B81B 3/0018; B81B 2203/04; B81B 2201/0235; G01C 19/5628
USPC .......................... 73/504.12, 514.01, 514.18, 73/514.31–514.34, 514.35, 514.36, 514.37
See application file for complete search history.

(56) References Cited

U.S. PATENT DOCUMENTS

| 8,806,940 B2 | 8/2014 | Classen |
| 2012/0216616 A1* | 8/2012 | Schultz ................. G01P 15/125 73/514.38 |

(Continued)

FOREIGN PATENT DOCUMENTS

| JP | 2012-135819 A | 7/2012 |
| JP | 2013-185959 A | 9/2013 |

OTHER PUBLICATIONS

Extended European Search Report for Patent Application No. EP18191138.9 dated Oct. 29, 2018 (7 pages).

*Primary Examiner* — Robert R Raevis
(74) *Attorney, Agent, or Firm* — Harness, Dickey & Pierce, P.L.C.

(57) ABSTRACT

A physical quantity sensor includes a movable flat plate having a plurality of openings passing therethrough that is swingable around an axis of rotation, a support substrate linked to the flat plate via a column to suspend the movable flat plate over the support substrate via a gap, and a protrusion protruding toward the movable element. In a plan view, the openings are excluded from a D/2-width annular range surrounding the outer circumference of the protrusion, where D is the maximum outer diametrical dimension of the protrusion.

14 Claims, 15 Drawing Sheets

(56) References Cited

U.S. PATENT DOCUMENTS

| | | | |
|---|---|---|---|
| 2013/0167641 A1* | 7/2013 | Heller | G01P 15/125 |
| | | | 73/514.01 |
| 2015/0096378 A1 | 4/2015 | Kigure | |
| 2016/0349286 A1* | 12/2016 | Ullrich | G01P 15/125 |
| 2017/0023606 A1* | 1/2017 | Naumann | B81B 7/0016 |
| 2017/0088413 A1 | 3/2017 | Tanaka | |
| 2019/0120872 A1* | 4/2019 | Geisberger | B81B 3/0051 |

* cited by examiner

PHYSICAL QUANTITY SENSOR, METHOD FOR MANUFACTURING PHYSICAL QUANTITY SENSOR, COMPLEX SENSOR, INERTIA MEASUREMENT UNIT, PORTABLE ELECTRONIC APPARATUS, ELECTRONIC APPARATUS, AND VEHICLE

BACKGROUND

1. Technical Field

The present invention relates to a physical quantity sensor, a method for manufacturing the physical quantity sensor, a complex sensor, an inertia measurement unit, a portable electronic apparatus, an electronic apparatus, and a vehicle.

2. Related Art

A known physical quantity detector used to detect acceleration is configured in accordance with a rocker lever principle and detects acceleration acting in the vertical direction from capacitance that changes in accordance with the acceleration. For example, JP-A-2013-185959 discloses a physical quantity sensor formed of a movable element including a movable electrode section, a beam that supports the movable element, and a fixed electrode disposed on a substrate so as to face the movable electrode section. The physical quantity sensor needs to be configured to prevent the movable element from colliding with the substrate and breaking when an apparatus including the physical quantity sensor, for example, falls and receives an impact so that excessive acceleration acts on the physical quantity sensor and the movable element undergoes a severe seesaw swing motion (displacement). The physical quantity sensor described in JP-A-2013-185959 includes a protrusion that is provided on the substrate (support substrate) to restrict displacement of the movable element.

On the other hand, some physical quantity sensors are so skillfully designed that the acceleration detection sensitivity is improved. For example, the physical quantity sensor described in U.S. Pat. No. 8,806,940 is provided with openings that pass through a movable element for reducing air resistance (squeeze film damping, hereinafter referred to as damping) between the movable element and a substrate on which a fixed electrode is disposed when the movable element is displaced toward the substrate. Since the movable element in JP-A-2013-185959 does not include an opening that reduces the damping, acceleration is detected with low sensitivity.

The physical quantity sensor described in U.S. Pat. No. 8,806,940, however, which is provided with openings over the entire surface of the movable element, has the following problem. In a case where the support substrate of the physical quantity sensor is provided with the protrusion described in JP-A-2013-185959 so that displacement of the movable element is restricted, and when the latticed frame formed by the openings adjacent to each other locally comes into contact with the protrusion, the frame of the movable element is quite likely to be broken. Thus, it is difficult to provide a physical quantity sensor having improved detection sensitivity and reliability.

SUMMARY

An advantage of some aspects of the invention is to solve at least a part of the problems described above, and the invention can be implemented in the following forms or as application examples.

Application Example 1

A physical quantity sensor according to this application example includes a movable element that is shaped into a flat plate, has a plurality of openings in a direction passing through a flat plate surface of the flat plate, and is swingable around an axis of rotation, a support substrate linked to part of the flat plate surface via a column to support the movable element with a gap between the flat plate surface of the movable element and the support substrate, and a protrusion provided so as to protrude toward the movable element in a region of the support substrate where the protrusion overlaps with the movable element with a gap therebetween when the support substrate is viewed in a direction perpendicular to the flat plate surface, and when the support substrate is viewed in the direction perpendicular to the flat plate surface, the openings are provided in a region excluding a D/2-width annular range around an outer circumference of the protrusion, where D represents a maximum outer dimension of the protrusion.

According to this application example, the movable element of the physical quantity sensor has a plurality of openings in the direction passing through the flat plate surface of the flat plate. The movable element is supported by the support substrate with a gap between the movable element and the support substrate with part of the flat plate surface linked to the support substrate via a column. The protrusion protruding toward the movable element is provided in the region of the support substrate where the protrusion overlaps with the movable element when the support substrate is viewed in the direction perpendicular to the flat plate surface. The openings of the movable element are provided in the region excluding the D/2-width annular range around the outer circumference of the protrusion, where D represents the maximum outer dimension of the protrusion. In other words, since no opening is provided in the region where the movable element might come into contact with the protrusion, the rigidity of the region is improved. Therefore, when excessive acceleration acts on the physical quantity sensor and the movable element comes into contact with the protrusion, damage of the movable element can be avoided. Further, since the movable element is provided with the openings in the region excluding the D/2-width annular region around the outer circumference of the protrusion, the damping acting on the movable element is reduced, and a physical quantity is detected with improved sensitivity. A physical quantity sensor having improved reliability and detection sensitivity can therefore be provided.

Application Example 2

In the physical quantity sensor according to the application example, it is preferable that more than one protrusion is provided.

According to this application example, more than one protrusion protrudes from the support substrate toward the movable element. The impact produced when the movable element comes into contact with the protrusions can therefore be divided to (spread among) a plurality of locations.

Application Example 3

In the physical quantity sensor according to the application example, it is preferable that the protrusions are provided symmetrically with respect to a center line that halves the movable element and extends along the axis of rotation.

According to this application example, the protrusions protruding from the support substrate toward the movable element are provided symmetrically with respect to the center line that halves the movable element and extends in the axial direction of the axis of rotation. The configuration described above avoids a situation in which the movable element twists and is therefore broken when the movable element comes into contact with the protrusion.

Application Example 4

In the physical quantity sensor according to the application example, it is preferable that the protrusion is provided in a position where a distance between the axis of rotation and the protrusion is smaller than or equal to half of a distance between the axis of rotation and an end edge of the movable element in a direction that intersects (perpendicular to) an axial direction of the axis of rotation.

According to this application example, the protrusion protruding from the support substrate toward the movable element is provided in a position where the distance between the axis of rotation and the protrusion is smaller than or equal to half of the distance between the axis of rotation and an end of the movable element in the direction that intersects the axial direction of the axis of rotation. The damping acting on the movable element increases with distance toward the end of the movable element. Forming the region where no opening is provided and which corresponds to the protrusion in a position close to the axis of rotation where the effect of the damping is small allows the damping acting on the movable element to be reduced.

Application Example 5

A method for manufacturing a physical quantity sensor according to this application example is a method for manufacturing a physical quantity sensor including a movable element that is shaped into a flat plate, has a plurality of openings in a direction passing through a flat plate surface of the flat plate, and is swingable around an axis of rotation, a support substrate linked to part of the flat plate surface via a column to support the movable element with a gap between the flat plate surface of the movable element and the support substrate, and a protrusion provided so as to protrude toward the movable element in a region of the support substrate where the protrusion overlaps with the movable element with a gap therebetween when the support substrate is viewed in a direction perpendicular to the flat plate surface, the physical quantity sensor so configured that when the support substrate is viewed in the direction perpendicular to the flat plate surface, the openings are provided in a region excluding a D/2-width annular range around an outer circumference of the protrusion, where D represents a maximum outer dimension of the protrusion, the method including forming the support substrate and the protrusion, bonding the support substrate to a silicon substrate, and forming the movable element having the openings from the silicon substrate.

According to this application example, the method for manufacturing a physical quantity sensor includes the support substrate formation step of forming the support substrate and the protrusion, the substrate bonding step of bonding the support substrate to a silicon substrate, and the movable element formation step of forming the movable element having the openings from the silicon substrate. First, a space (cavity) in which the movable element is swingable is formed in the support substrate and the protrusion is formed in the cavity in the support substrate formation step. The silicon substrate, which is the raw material of the movable element, is then bonded to the support substrate in the substrate bonding step. The outer shape and the openings of the movable element are then formed in the movable element formation step. In the manufacturing method according to this application example, the openings are formed after the cavity is formed in the support substrate.

On the other hand, as another method for manufacturing the physical quantity sensor, it is conceivable to employ a method for bonding a silicon substrate on which a sacrificial layer is formed to a support substrate via the sacrificial layer and forming a cavity in which the movable element is swingable in the sacrificial layer. In the case of the other manufacturing method, after the movable element is formed by using the silicon substrate, the sacrificial layer is etched via the openings formed in the movable element. To this end, the movable element needs to be provided with the openings with no region where no opening is provided.

In the manufacturing method according to this application example, after the cavity is formed, the silicon substrate is bonded to the support substrate, and the movable element and the openings are formed. The manufacturing method according to this application example allows the configuration in which the openings are provided in the region excluding the D/2-width annular range around the outer circumference of the protrusion when the support substrate is viewed in the direction perpendicular to the flat plate surface, where D represents the maximum outer dimension of the protrusion. In other words, the manufacturing method allows a configuration in which no opening is provided in the region where the movable element comes into contact with the protrusion. Therefore, since the rigidity of the region where the movable element comes into contact with the protrusion is improved, damage of the movable element is avoided when excessive acceleration acts on the physical quantity sensor and the movable element comes into contact with the protrusion. Further, since the movable element is provided with the openings in the region excluding the D/2-width annular region around the outer circumference of the protrusion, the damping acting on the movable element is reduced, and a physical quantity is detected with improved sensitivity. A method for manufacturing a physical quantity sensor having improved reliability and detection sensitivity can therefore be provided.

Application Example 6

A complex sensor according to this application example includes the physical quantity sensor described in any one of the application examples described above and an angular velocity sensor.

According to this application example, the complex sensor can be readily configured, and acceleration data and angular velocity data, for example, can be acquired.

Application Example 7

An inertia measurement unit according to this application example includes the physical quantity sensor described in any one of the application examples described above, an angular velocity sensor, and a controller that controls the physical quantity sensor and the angular velocity sensor.

According to this application example, the physical quantity sensor having improved impact resistance allows a more reliable inertia measurement unit to be provided.

Application Example 8

A portable electronic apparatus according to this application example includes the physical quantity sensor described in any one of the application examples described above, an enclosure that accommodates the physical quantity sensor, a processor that is accommodated in the enclosure and processes data outputted from the physical quantity sensor, a display section accommodated in the enclosure, and a light transmissive cover that closes an opening of the enclosure.

According to this application example, data outputted from the physical quantity sensor having improved impact resistance allows a reliable portable electronic apparatus with further improved control reliability to be provided.

Application Example 9

An electronic apparatus according to this application example includes the physical quantity sensor described in any one of the application examples described above and a controller that performs control based on a detection signal outputted from the physical quantity sensor.

According to this application example, an electronic apparatus including the physical quantity sensor having improved physical quantity detection sensitivity and improved reliability can be provided.

Application Example 10

A vehicle according to this application example includes the physical quantity sensor described in any one of the application examples described above and a controller that performs control based on a detection signal outputted from the physical quantity sensor.

According to this application example, a vehicle including the physical quantity sensor having improved physical quantity detection sensitivity and improved reliability can be provided.

BRIEF DESCRIPTION OF THE DRAWINGS

Embodiments of the invention will be described with reference to the accompanying drawings, wherein like numbers reference like elements.

DESCRIPTION OF EXEMPLARY EMBODIMENTS

An embodiment of the invention will be described below with reference to the drawings. In the following drawings, each layer and each member are drawn at scales different from actual scales so as to be large enough to be recognizable.

In FIGS. 1 to 6 and FIGS. 8 to 14, three axes X, Y, and Z perpendicular to one another are drawn for ease of description. The side facing the front end of the arrow representing the direction of each of the axes is called a "positive side," and the side facing the base end side of the arrow is called a "negative side." Further, in the following description, the direction parallel to the axis X is called an "X-axis direction," the direction parallel to the axis Y is called a "Y-axis direction," and the direction parallel to the axis Z is called a "Z-axis direction."

Embodiment

Configuration of Physical Quantity Sensor

Figure 1:
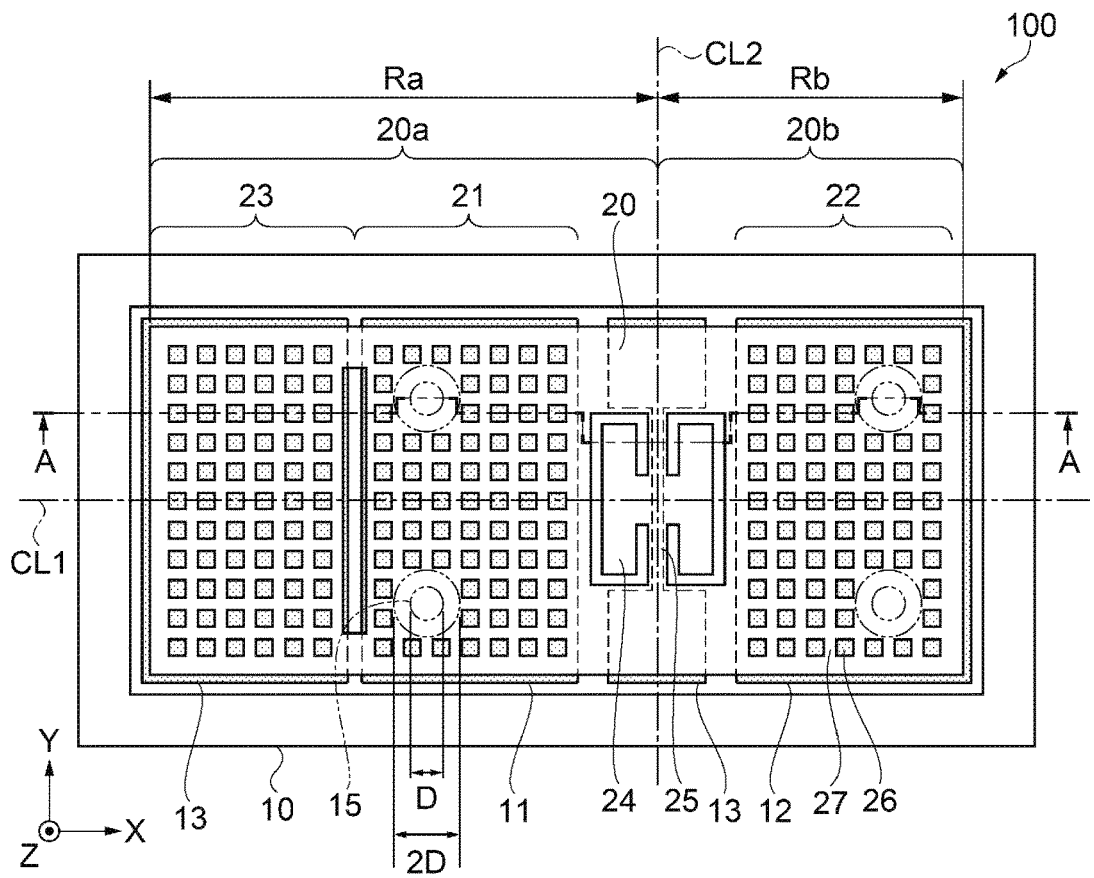
FIG. 1 is a plan view diagrammatically showing a physical quantity sensor according to an embodiment.
Figure 2:
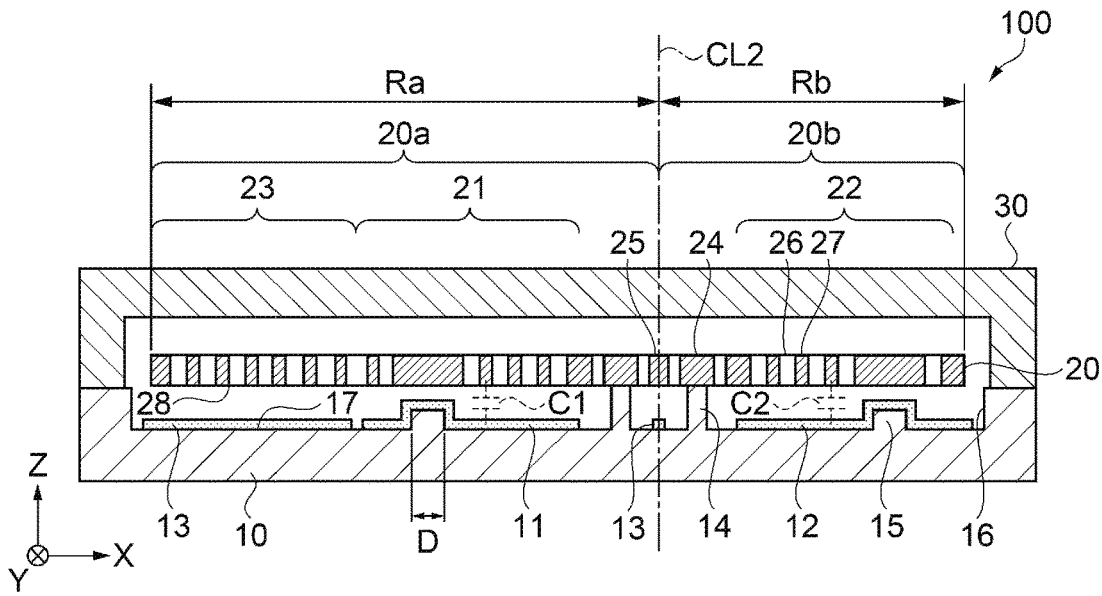
FIG. 2 is a cross-sectional view taken along the line A-A in FIG. 1.

FIG. 1 is a plan view diagrammatically showing a physical quantity sensor according to an embodiment. FIG. 2 is a cross-sectional view taken along the line A-A in FIG. 1. A schematic configuration of a physical quantity sensor 100 according to the embodiment will first be described with reference to FIGS. 1 and 2. In FIG. 1, a lid 30 is omitted for ease of description.

The physical quantity sensor 100 according to the present embodiment can be used, for example, as an inertia sensor. Specifically, the physical quantity sensor 100 can be used, for example, as an acceleration sensor for measuring acceleration in the vertical direction (Z-axis direction) (capacitance-type acceleration sensor, capacitance-type MEMS acceleration sensor). In the present embodiment, it is assumed that the vertical direction is called the axis Z, the axial direction of the axis of rotation (beam 25), which will be described later, is called the axis Y, and the direction that intersects both the axes Z and Y is called the axis X.

The physical quantity sensor 100 is shaped into a flat plate and includes a movable element 20 (movable plate or proof mass), which has a flat plate surface 28 of the flat plate, a support substrate 10, which supports the movable element 20, and a lid 30, which along with the support substrate 10 encapsulates the movable element 20, as shown in FIGS. 1 and 2.

The support substrate 10 has a cavity 16 having a recessed shape. A first fixed electrode 11 and a second fixed electrode 12 are provided on a principal surface 17 in the cavity 16. Further, a column 14 (columnar post) is provided between the first fixed electrode 11 and the second fixed electrode 12 and supports the movable element 20 with a gap between the flat plate surface 28 and the two electrodes. Further, protrusions 15 (cylindrical protrusions), which protrude toward the movable element 20 (+Z-axis side), are provided on opposite (lateral) sides of the column 14 in the X-axis direction. The column 14 and the protrusions 15 are formed integrally with the support substrate 10. The material of the support substrate 10 is not limited to a specific material, and borosilicate glass (hereinafter referred to as glass), which is an insulating material, is employed as a preferable example in the present embodiment.

The first fixed electrode 11 is located on the −X-axis side of the column 14 in the side view along the Y-axis direction and overlaps with a first mass section 21, which will be described later, in the plan view along the Z-axis direction. The second fixed electrode 12 is located on the +X-axis side of the column 14 in the side view along the Y-axis direction and overlaps with a second mass section 22, which will be described later, in the plan view along the Z-axis direction. The first and second fixed electrodes 11, 12 can be formed of an electrically conductive film made, for example, of platinum (Pt), aluminum (Al), molybdenum (Mo), chromium (Cr), titanium (Ti), nickel (Ni), copper (Cu), silver (Ag), gold (Au), or indium tin oxide (ITO).

The movable element 20 includes a support 24 and a beam 25 as the axis of rotation. The support 24 is part of the flat plate surface 28 and is linked to the support substrate 10 via the column 14. The beam 25 is supported by the support 24 and extends from the support 24 in the Y-axis direction. The beam 25 has the function of a torsion spring. The beam 25 swingably supports the entire movable section 20 via the support 24 and the column 14 relative to the support substrate 10.

The movable element 20 includes a first movable element 20a and a second movable element 20b. The first movable element 20a is a region on the −X-axis-direction side of a center line CL2, which is the center of rotation of the beam 25, and the second movable element 20b is a region on the +X-axis-direction side of the center line CL2, which is the center of rotation of the beam 25. The first movable element 20a is provided with the first mass section 21 (a first perforated mass panel) and a third mass section 23 sequentially arranged from the beam 25 in the −X-axis direction. The second movable element 20b is provided with the second mass section 22 (a second perforated mass panel). The first mass section 21 overlaps with the first fixed electrode 11, and the second mass section 22 overlaps with the second fixed electrode 12 in the plan view along the Z-axis direction.

The material of the movable element 20 is not limited to a specific material and is silicon, which is an electrically conductive material, as a preferable example in the present embodiment. Forming the movable element 20 with an electrically conductive material allows the first mass section 21 and the second mass section 22 to each function as an electrode. Alternatively, the movable element may be formed of a non-electrically conductive substrate, and the first and second mass sections may each be formed of an electrically conductive layer provided on the non-electrically conductive substrate.

The movable element 20 is supported by the beam 25 and swingable around the beam 25, which serves as the axis of rotation. Seesaw motion (inclination) of the movable element 20 around the beam 25 as a pivot point changes the gap (distance) between the first mass section 21 and the first fixed electrode 11 and the gap (distance) between the second mass section 22 and the second fixed electrode 12. The physical quantity sensor 100 allows determination of acceleration from a change in capacitance C1 between the first mass section 21 and the first fixed electrode 11 and a change in capacitance C2 between the second mass section 22 and the second fixed electrode 12 in accordance with the inclination of the movable element 20.

When acceleration in the vertical direction (gravitational acceleration) acts on the movable element 20, angular moment (moment of force) acts on each of the first movable element 20a and the second movable element 20b. When the angular moment acting on the first movable element 20a (counterclockwise angular moment, for example) balances with the angular moment acting on the second movable element 20b (clockwise angular moment, for example), the inclination of the movable element 20 does not change, and no acceleration can therefore be detected. The movable element 20 is therefore so designed that acceleration in the vertical direction acting on the movable element 20 causes the angular moment acting on the first movable element 20a not to balance with the angular moment acting on the second movable element 20b so that the movable element 20 inclines by a predetermine amount.

In the physical quantity sensor 100, the beam 25 is disposed in a position shifted from the center of gravity of the movable element 20 in the X-axis direction. In other words, since the first movable element 20a is provided with the third mass section 23, the distance Ra from the center line CL2, which is the axis of rotation of the beam 25, to the end surface of the first movable element 20a differs from the distance Rb from the center line CL2 to the end surface of the second movable element 20b. The first movable element 20a and the second movable element 20b therefore differ from each other in terms of mass. That is, one side of the movable element 20 (first movable element 20a) and the other side thereof (second movable element 20b) divided by the center line CL2 of the beam 25 differ from each other in terms of mass. The different masses of the first movable element 20a and the second movable element 20b allow the angular moment acting on the first movable element 20a and the angular moment acting on the second movable element 20b produced when acceleration in the vertical direction acts on the movable element 20 not to balance with each other.

The movable element 20 therefore inclines when acceleration in the vertical direction acts on the physical quantity sensor 100.

The capacitance (variable capacitance) C1 is created between the first mass section 21 and the first fixed electrode 11. Similarly, the capacitance (variable capacitance) C2 is created between the second mass section 22 and the second fixed electrode 12. The capacitance C1 changes in accordance with the gap (distance) between the first mass section 21 and the first fixed electrode 11, and the capacitance C2 changes in accordance with the gap (distance) between the second mass section 22 and the second fixed electrode 12.

For example, in a case where the movable element 20 is oriented in parallel with respect to the support substrate 10, the values of the capacitance C1 and C2 are roughly equal to each other. In detail, since the area where the first mass section 21 overlaps with the first fixed electrode 11 is equal to the area where the second mass section 22 overlaps with the second fixed electrode 12 in the plan view along the Z-axis direction, and the gap between the first mass section 21 and the first fixed electrode 11 is equal to the gap between the second mass section 22 and the second fixed electrode 12 in the side view along the Y-axis direction, the values of the capacitance C1 and C2 are equal to each other. Further, for example, when acceleration in the vertical direction acts on the movable element 20, and the movable element 20 inclines around the beam 25 as the axis of rotation accordingly, the values of the capacitance C1 and C2 change in accordance with the inclination of the movable element 20. When the movable element 20 inclines, the gap between the first mass section 21 and the first fixed electrode 11 differs from the gap between the second mass section 22 and the second fixed electrode 12, and the values of the capacitance C1 and C2 therefore also differ from each other.

FIGS. 3 to 6 are cross-sectional views diagrammatically showing the action of the physical quantity sensor. The relationship between the action and the capacitance of the physical quantity sensor will be described with reference to FIGS. 3 to 6. In FIGS. 3 to 6, components unnecessary for the description of the action are omitted.

Figure 3:
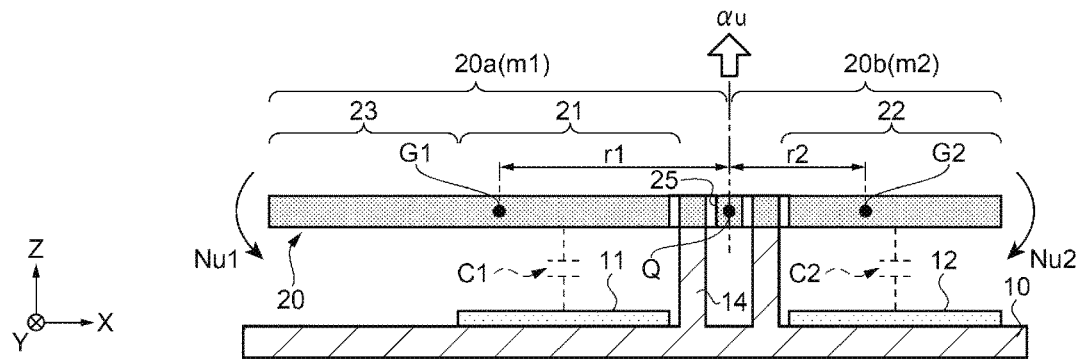
FIG. 3 is a cross-sectional view diagrammatically showing the action of the physical quantity sensor.

FIG. 3 shows a state in which the movable element 20 is oriented roughly parallel with respect to the support substrate 10. A case where acceleration au in the +Z-axis direction acts on the physical quantity sensor 100 in the state described above will be described.

The movable element 20 is shaped into an oblong flat plate having a uniform thickness (dimension in Z-axis direction). The first movable element 20a has a mass m1, and the center of gravity G1 of the first movable element 20a is located in the position shifted from the center Q of the beam 25, which is rotatably supported by the support 24, by a distance r1 in the −X-axis direction. The second movable element 20b has a mass m2, and the center of gravity G2 of the second movable element 20b is located in the position shifted from the center Q of the beam 25 by a distance r2 in the +X-axis direction. The first movable element 20a has a third mass section 23 and has an oblong shape longer in the X-axis direction than the second movable element 20b. Therefore, the mass m1 of the first movable element 20a is greater than the mass m2 of the second movable element 20b, and the distance r1 to the position of the center of gravity G1 of the first movable element 20a is longer than the distance r2 to the position of the center of gravity G2 of the second movable element 20b.

When the acceleration αu, which is oriented from the −Z side toward the +Z side in the Z-axis direction, acts on the physical quantity sensor 100, first angular moment Nu1, which corresponds to the product of the mass m1, the acceleration αu, and the distance r1, acts on the first movable element 20a in the counterclockwise direction around the center Q of the beam 25 as the axis of rotation. On the other hand, second angular moment Nu2, which corresponds to the product of the mass m2, the acceleration αu, and the distance r2, acts on the second movable element 20b in the clockwise direction around the center Q of the beam 25 as the axis of rotation. Since the mass m1 of the first movable element 20a is greater than the mass m2 of the second movable element 20b, and the distance r1 to the position of the center of gravity G1 of the first movable element 20a is longer than the distance r2 to the position of the center of gravity G2 of the second movable element 20b, the first angular moment Nu1 acting on the first movable element 20a is greater than the second angular moment Nu2 acting on the second movable element 20b.

Figure 4:
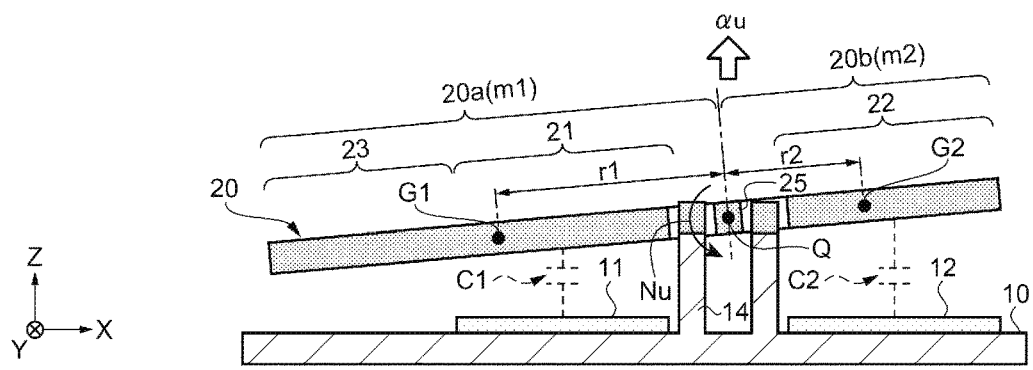
FIG. 4 is a cross-sectional view diagrammatically showing the action of the physical quantity sensor.

As a result, torque Nu, which corresponds to the difference between the first angular moment Nu1 (see FIG. 3) and the second angular moment Nu2 (see FIG. 3), acts on the beam 25 in the counterclockwise direction around the center Q of the beam 25 as the axis of rotation, so that the movable element 20 inclines counterclockwise, as shown in FIG. 4. As a result, the gap between the first mass section 21 of the first movable element 20a and the first fixed electrode 11 decreases (is narrower), and the value of the capacitance C1 created between the first mass section 21 and the first fixed electrode 11 increases accordingly. On the other hand, the gap between the second mass section 22 of the second movable element 20b and the second fixed electrode 12 increases (is wider), and the value of the capacitance C2 created between the second mass section 22 and the second fixed electrode 12 decreases accordingly.

Figure 5:
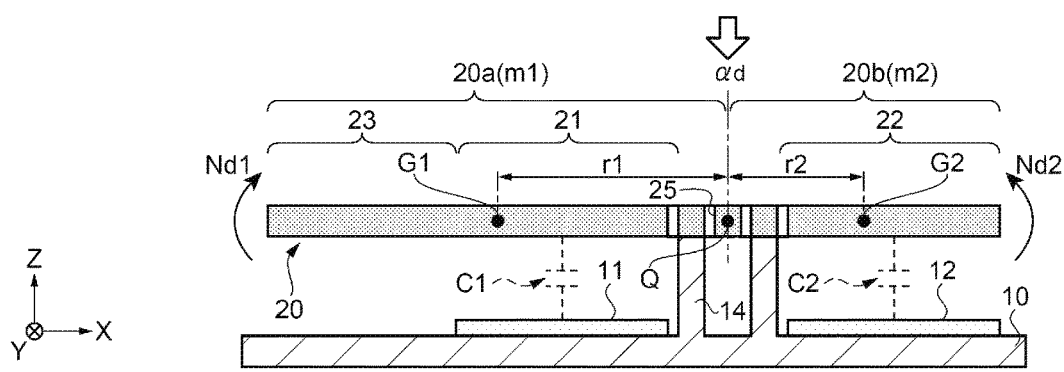
FIG. 5 is a cross-sectional view diagrammatically showing the action of the physical quantity sensor.

FIG. 5 shows a state in which the movable element 20 is oriented roughly parallel with respect to the support substrate 10. A case where acceleration αd in the −Z-axis direction acts on the physical quantity sensor 100 in the state described above will be described.

When the acceleration ad, which is oriented from the +Z side toward the −Z side in the Z-axis direction, acts on the physical quantity sensor 100, first angular moment Nd1, which corresponds to the product of the mass m1, the acceleration αd, and the distance r1, acts on the first movable element 20a in the clockwise direction around the center Q of the beam 25 as the axis of rotation. On the other hand, second angular moment Nd2, which corresponds to the product of the mass m2, the acceleration αd, and the distance r2, acts on the second movable element 20b in the counterclockwise direction around the center Q of the beam 25 as the axis of rotation. Since the mass m1 of the first movable element 20a is greater than the mass m2 of the second movable element 20b, and the distance r1 to the position of the center of gravity G1 of the first movable element 20a is longer than the distance r2 to the position of the center of gravity G2 of the second movable element 20b, the first angular moment Nd1 acting on the first movable element 20a is greater than the second angular moment Nd2 acting on the second movable element 20b.

Figure 6:
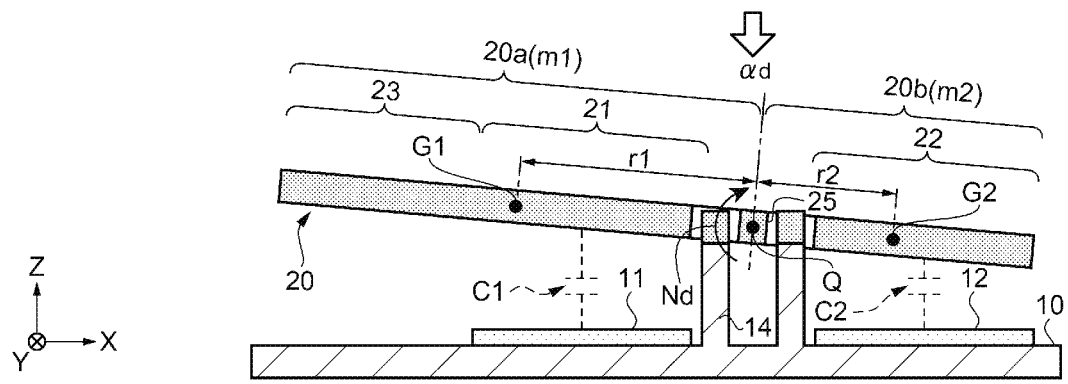
FIG. 6 is a cross-sectional view diagrammatically showing the action of the physical quantity sensor.

As a result, torque Nd, which corresponds to the difference between the first angular moment Nd1 (see FIG. 5) and the second angular moment Nd2 (see FIG. 5), acts on the beam 25 in the clockwise direction around the center Q of the beam 25 as the axis of rotation, so that the movable element 20 inclines clockwise, as shown in FIG. 6. As a result, the gap between the first mass section 21 of the first movable element 20a and the first fixed electrode 11 increases (is wider), and the value of the capacitance C1 created between the first mass section 21 and the first fixed electrode 11 decreases accordingly. On the other hand, the gap between the second mass section 22 of the second movable element 20b and the second fixed electrode 12 decreases (is narrower), and the value of the capacitance C2 created between the second mass section 22 and the second fixed electrode 12 increases accordingly.

The physical quantity sensor 100 allows the movable element 20 to incline by a large amount when a large amount of torque Nu or Nd acts on the beam 25, that is, when the physical quantity sensor 100 is configured to increase the difference in mass between the first movable element 20a and the second movable element 20b and the difference between the distance r1 from the beam 25 to the center of gravity G1 of the first movable element 20a and the distance r2 from the beam 25 to the center of gravity G2 of the second movable element 20b. The amount of increase or decrease in the values of the capacitance C1 and C2 therefore increases, whereby the physical quantity sensor 100 can detect a physical quantity with improved sensitivity. Further, the physical quantity sensor 100 allows the movable element 20 to incline by a large amount when the physical quantity sensor 100 is configured to reduce the width of the beam 25, which functions as a torsion spring, in the X-axis direction so that the toughness of the spring decreases, whereby the physical quantity sensor 100 can detect a physical quantity with improved sensitivity.

Openings (through holes) provided in the movable element and the protrusions provided on the support substrate will next be described. To prevent the movable element 20 from coming into contact with the support substrate 10 when excessive acceleration acts on the physical quantity sensor 100, the protrusions 15, which restrict displacement of the movable element 20, are upstandingly provided on the principal surface 17 of the support substrate 10, as shown in FIGS. 1 and 2. The protrusions 15 are provided in a region where the movable element 20 overlaps with the support substrate 10 with a gap therebetween when the support substrate 10 is viewed in the direction perpendicular to the flat plate surface 28 (Z-axis direction).

In the present embodiment, a plurality (two) of protrusions 15 are provided on the support substrate 10 in each of the regions where the first mass section 21 and the second mass section 22 overlap with the support substrate 10. The protrusions 15 each have a cylindrical shape having a diameter ranging from about 3 to 5 µm. The thus configured protrusions 15 avoid collision of the end of the movable element 20 with the support substrate 10 and resultant damage of the movable element 20. Further, the plurality of protrusions 15 allow the impact produced when the movable element 20 comes into contact with any of the protrusions 15 to be divided to (spread among) a plurality of locations. In the present embodiment, two protrusions 15 are provided in each of the regions corresponding to the first and second mass sections 21, 22 by way of example, but not necessarily. One protrusion 15 or three or more protrusions 15 may be provided. Still instead, the protrusions 15 on the side facing the first movable element 20a may be provided in the region corresponding to the third mass section 23. Further, the above description has been made of the case where the protrusions have each a cylindrical shape and may instead have a triangular, quadrangular, or polygonal columnar shape or a columnar shape having a chamfered upper surface. An insulating protective film may be formed on the surface of each of the protrusions 15. The configuration described above prevents an electrical short circuit that occurs when the first and second mass sections 21, 22 come into contact with any of the protrusions 15.

On the other hand, to reduce damping produced by the viscosity of a gas (effect of stopping motion of movable element, flow resistance) when acceleration in the vertical direction acts on the movable element 20 and the movable element 20 therefore swings, a plurality of openings 26 (through holes or perforations) are provided in the direction passing through the flat plate surface 28 (Z-axis direction). The openings 26 are provided in the region excluding D/2-width annular ranges around the outer circumferences of the protrusions 15 (2D-diameter ranges around centers of protrusions 15), where D represents the maximum outer diametrical dimension of the protrusion 15, when the support substrate 10 is viewed in the direction perpendicular to the flat plate surface 28 (Z-axis direction). Therefore, the damping acting on the movable element 20 is reduced, and a physical quantity is detected with improved sensitivity.

In the present embodiment, in the plan view along the Z-axis direction, square openings 26 are arranged in a matrix (e.g., a rectangular array of rows and columns) in the region excluding the 2D-diameter ranges, which are each a range around the center of the corresponding protrusion 15. In other words, no opening 26 is provided in the region (perforation free impact zones) where the movable element 20 comes into contact with any of the protrusions 15 when excessive acceleration acts on the physical quantity sensor 100 and the movable element 20 maximally swings.

Conversely, in a case where the openings 26 are also provided in the 2D-diameter ranges, which are each a region around the center of the corresponding protrusion 15, and when a latticed frame section 27, which is formed of the openings 26 adjacent to each other, locally comes into contact with any of the protrusions 15, the frame section 27 of the movable element 20 could be easily broken. In the physical quantity sensor 100 according to the present embodiment, however, since no opening 26 is provided in the regions that come into contact with the protrusions 15, the rigidity of the regions is improved. Therefore, when excessive acceleration acts on the physical quantity sensor 100 and the movable element 20 comes into contact with any of the protrusions 15, damage of the movable element 20 can be avoided. The plurality of openings 26 may instead have individually different shapes. Further, the positions where the openings 26 are disposed and the number of openings 26 may be set as desired.

The present embodiment has been made with reference to the case where the movable element 20 is provided as to be swingable with the aid of the beam 25 supported, for example, via the column 14 provided on the support substrate 10, but not necessarily. For example, the movable element may be provided so as to be swingable with the aid of a beam extending in the Y-axis direction from a frame-shaped support that surrounds the outer circumference of the movable element but is separate from the movable element by a predetermined gap in the plan view along the Z-axis direction.

Method for Manufacturing Physical Quantity Sensor

Figure 7:
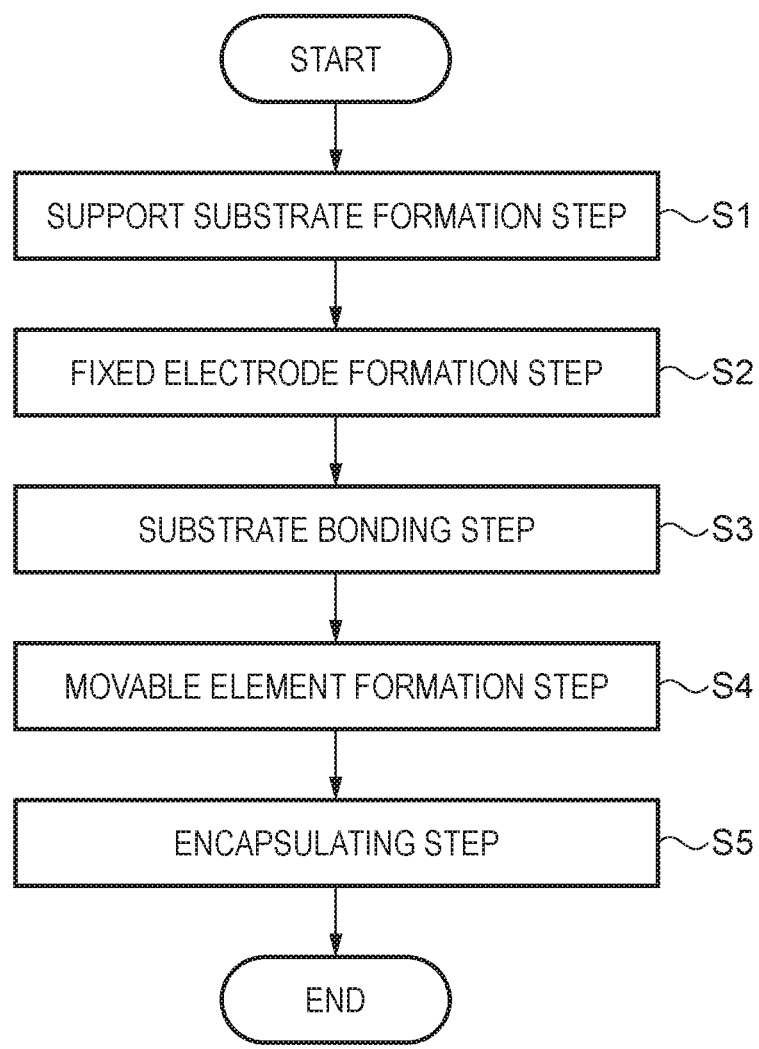
FIG. 7 is a flowchart for describing the steps of manufacturing the physical quantity sensor.

FIG. 7 is a flowchart for describing the steps of manufacturing the physical quantity sensor. FIGS. 8 to 12 are cross-sectional views in the steps of manufacturing the physical quantity sensor. The method for manufacturing the physical quantity sensor 100 will next be described with reference to FIGS. 7 to 12.

Figure 8:
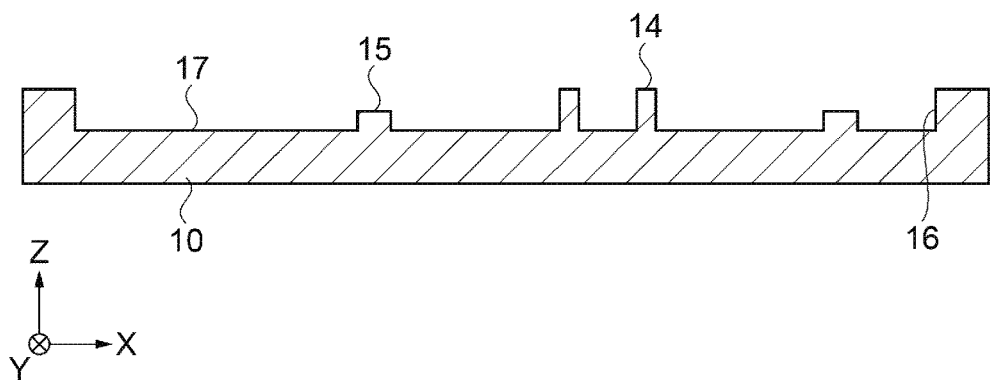
FIG. 8 is a cross-sectional view in one of the steps of manufacturing the physical quantity sensor.

Step S1 is a support substrate formation step of forming the support substrate 10 and the protrusions 15. A glass substrate is first prepared. In the support substrate formation step, the glass substrate is patterned by using photolithography and etching techniques to form the support substrate 10 and the protrusions 15. The glass substrate can, for example, be wet-etched with a hydrofluoric-acid-based etchant. The support substrate 10 formed of the glass substrate and having the cavity 16 having a recessed shape, the column 14, and the protrusions 15 can thus be produced, as shown in FIG. 8.

Figure 9:
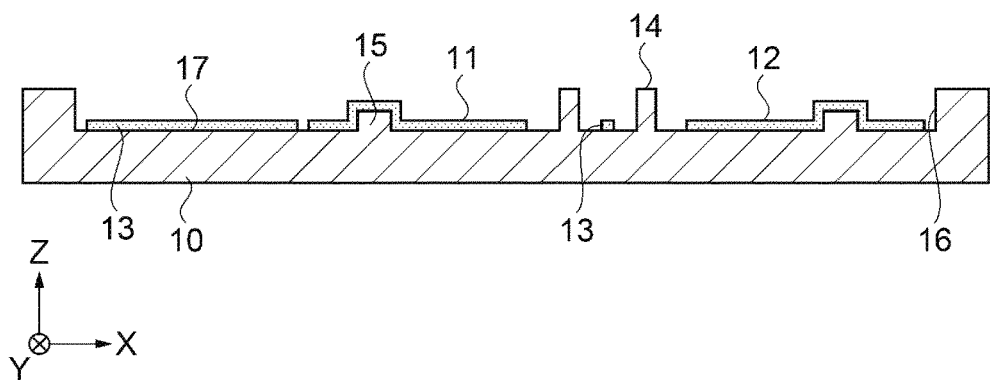
FIG. 9 is a cross-sectional view in one of the steps of manufacturing the physical quantity sensor.

Step S2 is a fixed electrode formation step of forming the first and second fixed electrodes 11, 12. In the fixed electrode formation step, after an electrically conductive film is deposited on the principal surface 17 of the support substrate 10 by using sputtering method or any other method, the electrically conductive film is patterned by using photolithography and etching techniques (such as dry etching, wet etching) to form the first and second fixed electrodes 11, 12. The first and second fixed electrodes 11, 12 can thus be provided on the principal surface 17 in the cavity 16 of the support substrate 10, as shown in FIG. 9.

Figure 10:
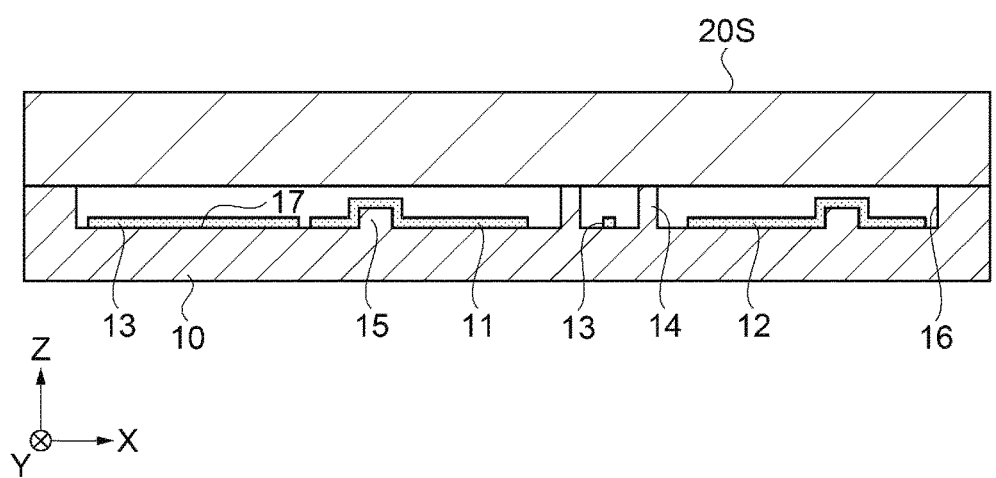
FIG. 10 is a cross-sectional view in one of the steps of manufacturing the physical quantity sensor.

Step S3 is a substrate bonding step of bonding the support substrate 10 to a silicon substrate 20S. In the substrate bonding step, the support substrate 10 is bonded to the silicon substrate 20S, for example, by using anode bonding, direct bonding, or an adhesive, as shown in FIG. 10.

Figure 11:
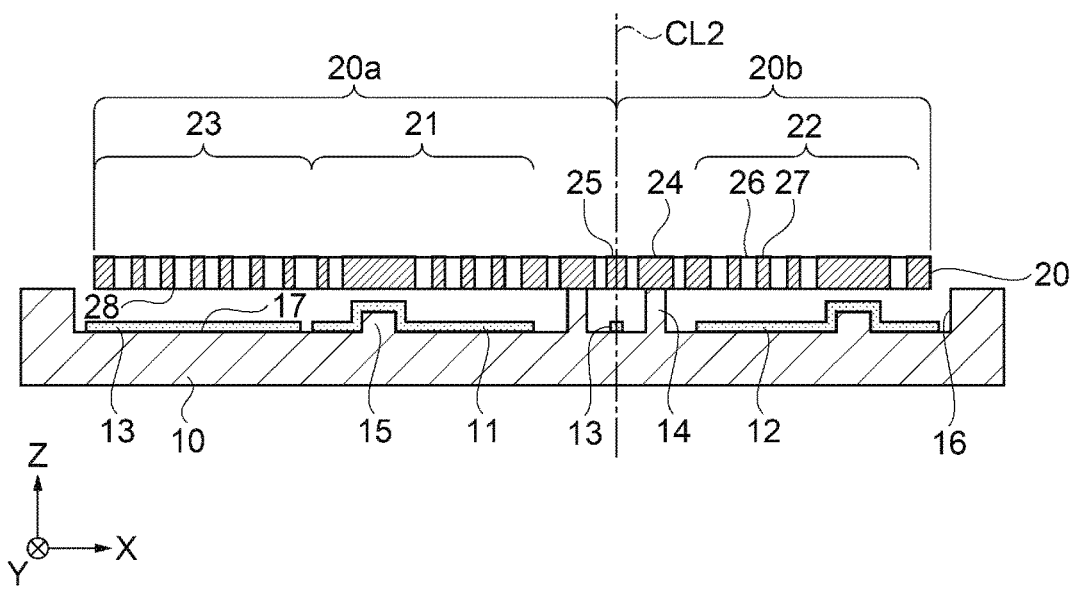
FIG. 11 is a cross-sectional view in one of the steps of manufacturing the physical quantity sensor.

Step S4 is a movable element formation step of forming the movable element 20 having the openings 26 from the silicon substrate 20S. In the movable element formation step, the silicon substrate 20S is polished, for example, by using a polisher to reduce the thickness of the silicon substrate 20S to a predetermined thickness. The silicon substrate 20S is then patterned by using photolithography and etching techniques to form the movable element 20. For example, the silicon substrate 20S can be etched in a Bosch process using a reactive ion etching (RIE) apparatus. The movable element 20 including the opening 26, the support 24, and the beam 25 is formed as an integrated part, as shown in FIG. 11.

Figure 12:
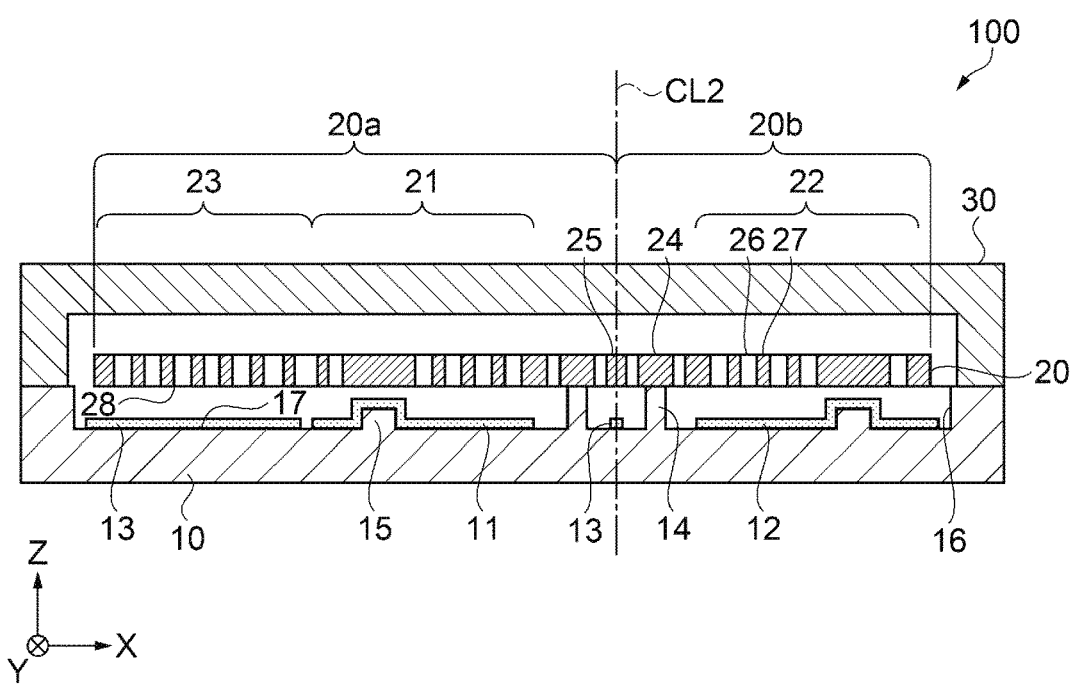
FIG. 12 is a cross-sectional view in one of the steps of manufacturing the physical quantity sensor.

Step S5 is an encapsulating step of sealing the movable element 20. In the encapsulating step, a lid 30 is bonded to the support substrate 10 so that the movable element 20 is accommodated in the space formed by the support substrate 10 and the lid 30. The support substrate 10 and the lid 30 are bonded to each other, for example, by using anode bonding or an adhesive. The physical quantity sensor 100 is thus produced, as shown in FIG. 12.

In the present embodiment, the method for manufacturing the physical quantity sensor 100 including the step of forming the cavity 16, in which the movable element 20 is swingable, in the support substrate 10 is shown. On the other hand, as another method for manufacturing the physical quantity sensor, it is conceivable to employ a method for bonding a silicon substrate on which a sacrificial layer is formed to a support substrate via the sacrificial layer and forming a cavity in which the movable element is swingable in the sacrificial layer. In the case of the other manufacturing method, after the movable element is formed by using the silicon substrate, the sacrificial layer sandwiched between the silicon substrate and the support substrate is etched via the openings of the movable element that have been formed simultaneously with the formation of the movable element to form the cavity, in which the movable element is swingable, in the sacrificial layer. To this end, the movable element needs to be provided with the openings in a matrix with no region where no opening is provided. In other words, the configuration in which no opening is provided in the regions where the movable element comes into contact with the protrusions cannot be employed.

The manufacturing method according to the present embodiment includes forming the cavity 16 and the protrusions in the support substrate 10 in the support substrate formation step, then bonding the support substrate 10 to the silicon substrate 20S in the substrate bonding step, and forming the movable element 20 and the openings 26 in the last step. The manufacturing method allows the configuration in which no opening 26 is provided in the regions where the movable element 20 comes into contact with the protrusions 15. Since the rigidity of the regions where the movable element 20 comes into contact with the protrusions 15 is therefore improved, damage of the movable element 20 is avoided when excessive acceleration acts on the physical quantity sensor 100 and the movable element 20 comes into contact with any of the protrusions 15. Further, since the movable element 20 is provided with the openings 26 in the region excluding the D/2-width annular regions around the outer circumferences of the protrusions 15, the damping acting on the movable element 20 is reduced, and a physical quantity is detected with improved sensitivity.

As described above, the physical quantity sensor 100 according to the present embodiment can provide the following effects.

The physical quantity sensor 100 includes the protrusions 15, which protrude from the support substrate 10 toward the movable element 20. The movable element 20 is provided with the plurality of openings 26, which pass through the flat plate surface 28. The protrusions 15 are provided in the region where the support substrate 10 overlaps with the movable element 20 with a gap therebetween when the support substrate 10 is viewed in the direction perpendicular to the flat plate surface 28. The openings 26 are provided in the region excluding the 2D-diameter regions around the centers of the protrusions 15, where D represents the maximum outer dimension of the protrusion 15, when the support substrate 10 is viewed in the direction perpendicular to the flat plate surface 28. In other words, no opening 26 is provided in the 2D-diameter regions around the centers of the protrusions 15, that is, in the positions where the movable element 20 comes into contact with the protrusions 15. As a result, since the rigidity of the regions corresponding to the 2D-diameter ranges is improved, damage of the movable element 20 can be avoided when the movable element 20 comes into contact with any of the protrusions 15. Further, the damping acting on the movable element 20 is reduced by the plurality of openings 26 provided in the range excluding the 2D-diameter ranges around the centers of the protrusions 15, whereby the detection sensitivity of the physical quantity sensor 100 is improved. A physical quantity sensor 100 having improved reliability and detection sensitivity can therefore be provided.

Since a plurality of protrusions 15, which protrude from the support substrate 10 toward the movable element 20, are provided, impact produced when the movable element 20 comes into contact with any of the protrusions 15 can be divided among a plurality of locations.

The method for manufacturing the physical quantity sensor 100 includes the support substrate formation step of forming the support substrate 10 and the protrusions 15, the substrate bonding step of bonding the support substrate 10 to the silicon substrate S20, and the movable element formation step of forming the movable element 20 having the openings 26 from the silicon substrate 20S. In the present manufacturing method, after the cavity 16 and the protrusions 15 are formed in the support substrate 10 in the support substrate formation step, the support substrate 10 is bonded to the silicon substrate 20S in the substrate bonding step, and the movable element 20 and the openings 26 are formed in the last step. According to the manufacturing method, the configuration in which no opening 26 is provided in the regions where the movable element 20 comes into contact with the protrusions 15 (2D-diameter regions around centers of protrusions 15) can be achieved. As a result, since the rigidity of the regions is improved, damage of the movable element 20 can be avoided when the movable element 20 comes into contact with any of the protrusions 15. Further, the damping acting on the movable element 20 is reduced by the plurality of openings 26 provided in the region excluding the 2D-diameter ranges around the centers of the protrusions 15, whereby the detection sensitivity of the physical quantity sensor 100 is improved. The method for manufacturing a physical quantity sensor 100 having improved reliability and detection sensitivity can be provided.

The invention is not limited to the embodiments described above, and a variety of changes, improvements, and other modifications can be made to the embodiment described above.

Variations

Figure 13:
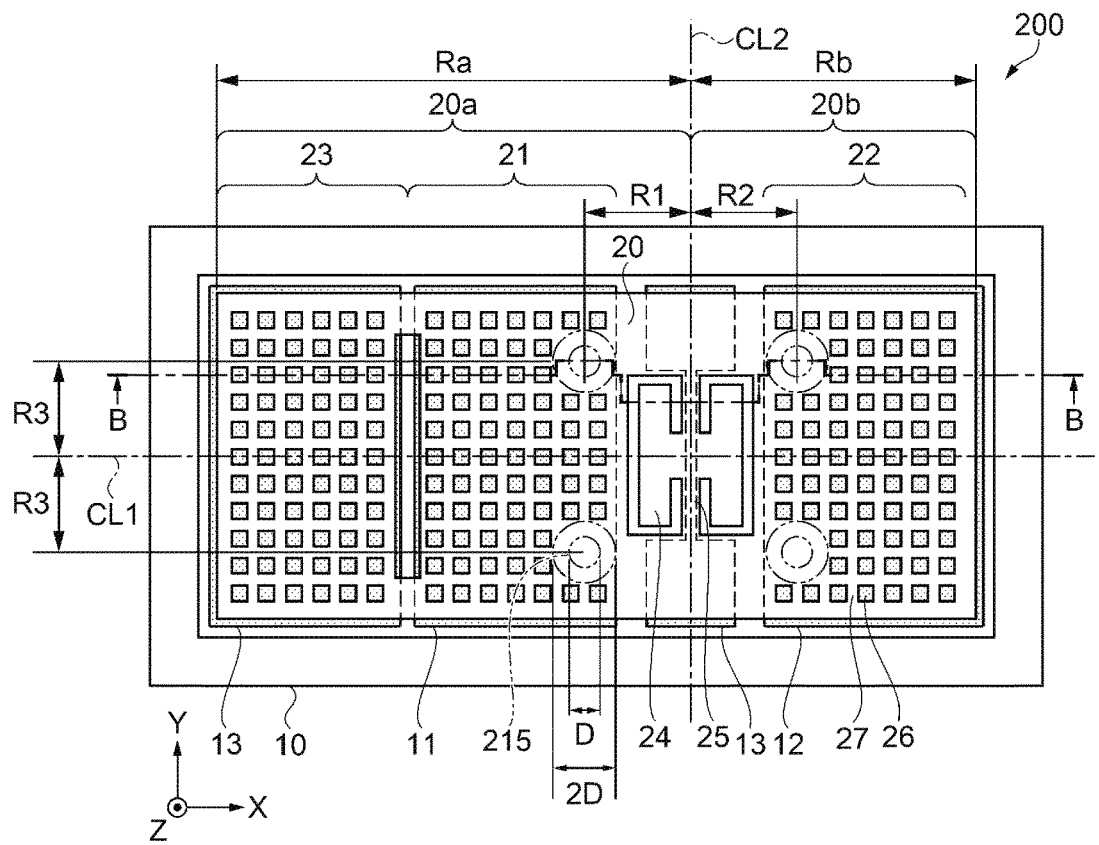
FIG. 13 is a plan view diagrammatically showing a physical quantity sensor according to a variation.
Figure 14:
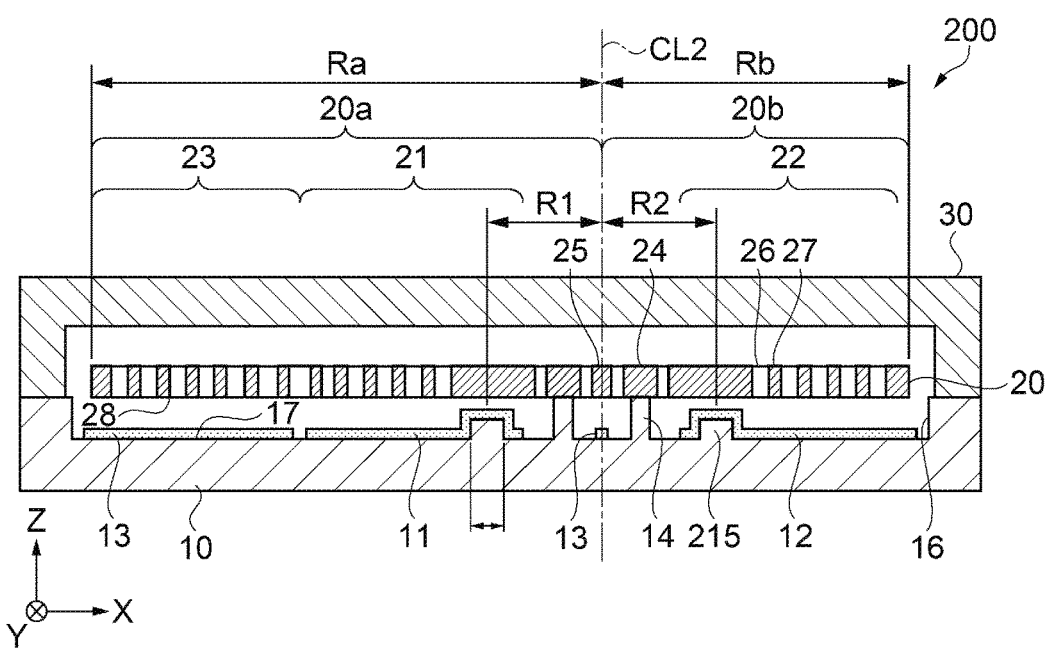
FIG. 14 is a cross-sectional view taken along the lien B-B in FIG. 13.

FIG. 13 is a plan view diagrammatically showing a physical quantity sensor according to a variation. FIG. 14 is a cross-sectional view taken along the line B-B in FIG. 13. A physical quantity sensor 200 according to variation 1 will be described below. The same configuration portions as those in the embodiment have the same reference characters, and no redundant description will be made. The physical quantity sensor 200 according to the present variation differs from the physical quantity sensor 100 described in the embodiment in terms of the positions of protrusions 215.

To prevent the movable element 20 from coming into contact with the support substrate 10 when excessive acceleration acts on the physical quantity sensor 200, the protrusions 215, which restrict displacement of the movable element 20, are provided on the principal surface 17 of the support substrate 10, as shown in FIGS. 13 and 14. The protrusions 215 are provided in the X-axis direction, which intersects the axial direction of the beam 25, which serves as the axis of rotation (Y-axis direction), so that the distance from the center line CL2 of the beam 25 to each of the protrusions 215 is smaller than or equal to half the distance Ra from the center line CL2 to the end edge of the movable element 20 on one side.

In detail, in the present variation, two protrusions 215 are provided on the support substrate 10 in each of the regions where the first mass section 21 and the second mass section 22 overlap with the support substrate 10. The protrusions 215 that overlap with the first mass section 21 are provided in positions separate from the center line CL2 by a distance R1 in the −X-axis direction. The distance R1 between the center line CL2 and these protrusions 215 is smaller than half the distance Ra between the center line CL2 and the one-side end edge of the first movable element 20a. The protrusions 215 that overlap with the second mass section 22 are provided in positions separate from the center line CL2 by a distance R2 in the +X-axis direction. The distance R2 between the center line CL2 and these protrusions 215 is smaller than half the distance Rb between the center line CL2 and the one-side end edge of the second movable element 20b. In the present variation, the distance R1 and the distance R2 are equal. That is, the protrusions 215 are provided symmetrically with respect to the center line CL2.

Since the moving speed of the movable element 20 increases as the distance from the beam 25 (center line CL2) increases, the damping acting on the movable element 20 increases with distance toward the end of the movable element. The regions where no opening 26 is provided and which correspond to the protrusions 215 in the present variation (2-diameter ranges around centers of protrusions 215) are each located in a position close to the beam 25 and within the distance Ra/2 or the distance Rb/2, where the effect of the damping is small in the X-axis direction, whereby the damping acting on the movable element 20 can be further reduced.

The protrusions 215 are provided in positions symmetric with respect to a center line CL1, which halves the movable element 20 and extends perpendicular to the axial direction of the beam 25 (Y-axis direction), which serves as the axis of rotation, and separate from the center line CL1 by a distance R3. The configuration described above avoids a situation in which the movable element 20 twists and is therefore broken when the movable element 20 comes into contact with any of the protrusions 215.

Complex Sensor

Figure 15:
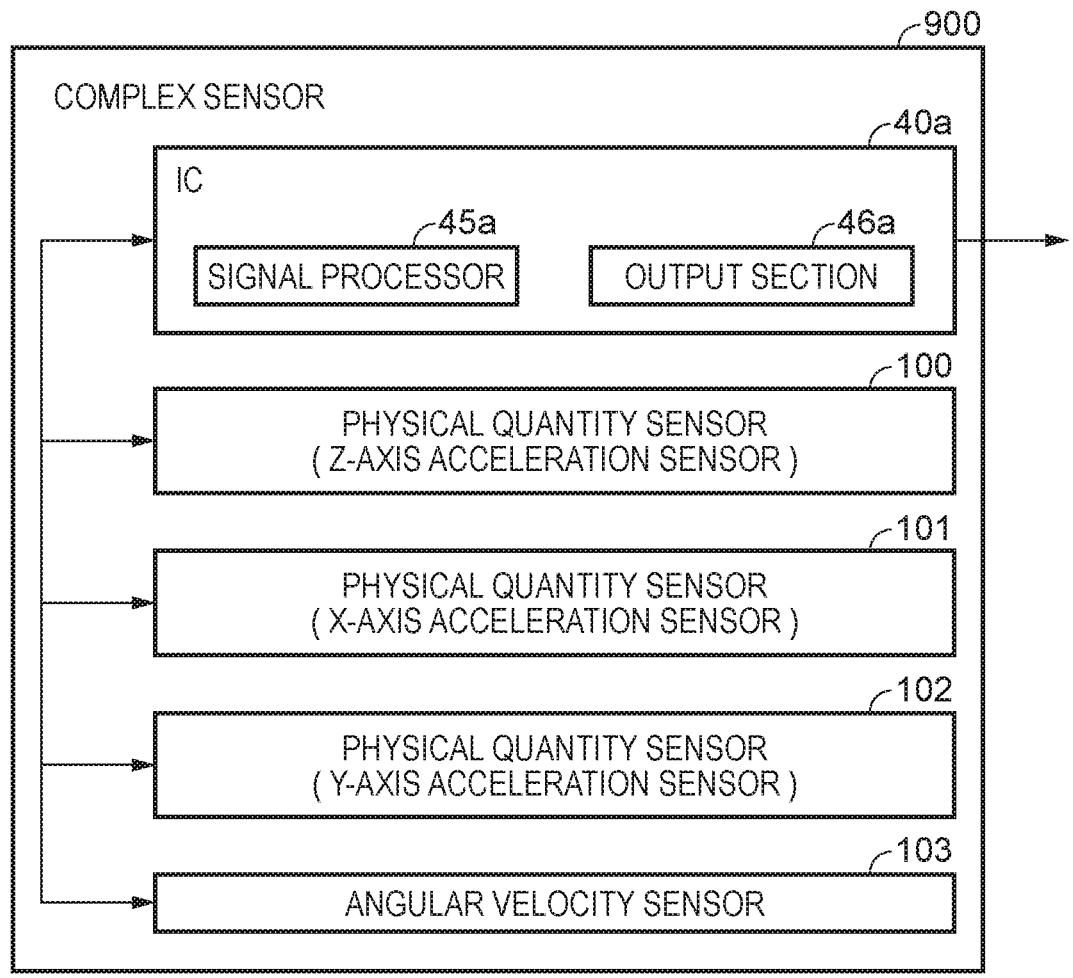
FIG. 15 is a functional block diagram showing a schematic configuration of a complex sensor.

An example of the configuration of a complex sensor including either of the physical quantity sensors 100 and 200 described above will next be described with reference to FIG. 15. FIG. 15 is a functional block diagram showing a schematic configuration of the complex sensor. The following description will be made with reference to a case where the physical quantity sensor 100 is used.

A complex sensor 900 includes the physical quantity sensor 100 described above, which is an acceleration sensor for measuring acceleration in the Z-axis direction, a physical quantity sensor 101, which is an acceleration sensor for measuring acceleration in the X-axis direction, a physical quantity sensor 102, which is an acceleration sensor for measuring acceleration in the Y-axis direction, and an angular velocity sensor 103, as shown in FIG. 15. The angular velocity sensor 103 can detect angular velocity in one desired axial direction in an efficient, precise manner. The angular velocity sensor 103 can include three angular velocity sensors 103 corresponding to the three axial directions for the measurement of the angular velocity in each of the axial directions. Further, the complex sensor 900 can include, for example, an IC 40a including a drive circuit that drives the physical quantity sensors 100, 101, and 102 and the angular velocity sensor 103, a detection circuit that detects acceleration and angular velocity in each of the axes X, Y, and Z based on signals from the physical quantity sensors 100, 101, and 102 and the angular velocity sensor 103 (signal processor 45a), and an output circuit that converts a signal from the detection circuit into a predetermined signal and outputs the predetermined signal (output section 46a), and other components.

The complex sensor 900 can be readily formed by the physical quantity sensors 100, 101, and 102 and the angular velocity sensor 103, and the single complex sensor 900 can readily acquire a plurality of sets of physical quantity data, for example, acceleration data and angular velocity data.

Inertia Measurement Unit

Figure 16:
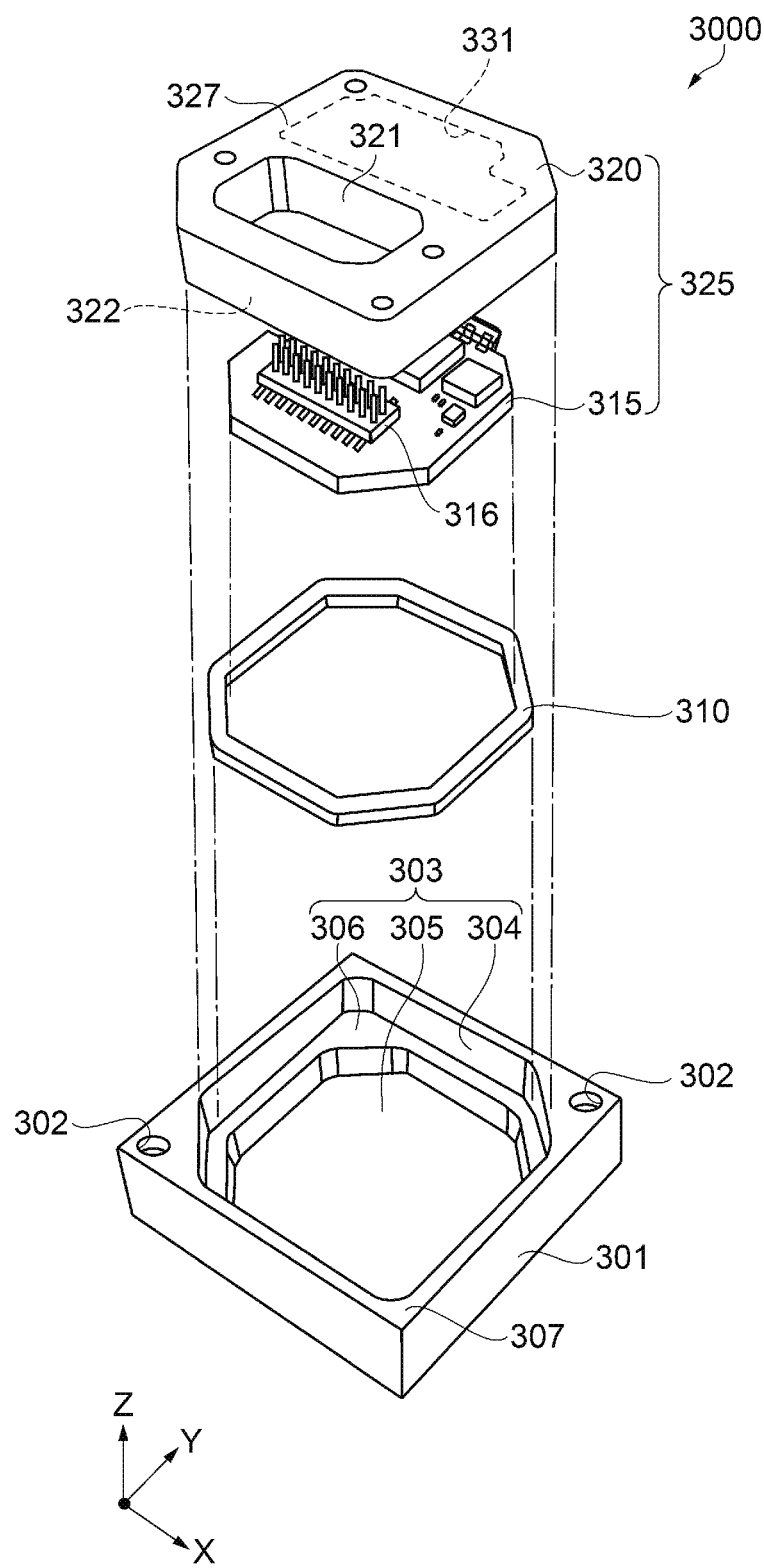
FIG. 16 is an exploded perspective view showing a schematic configuration of an inertia measurement unit.
Figure 17:
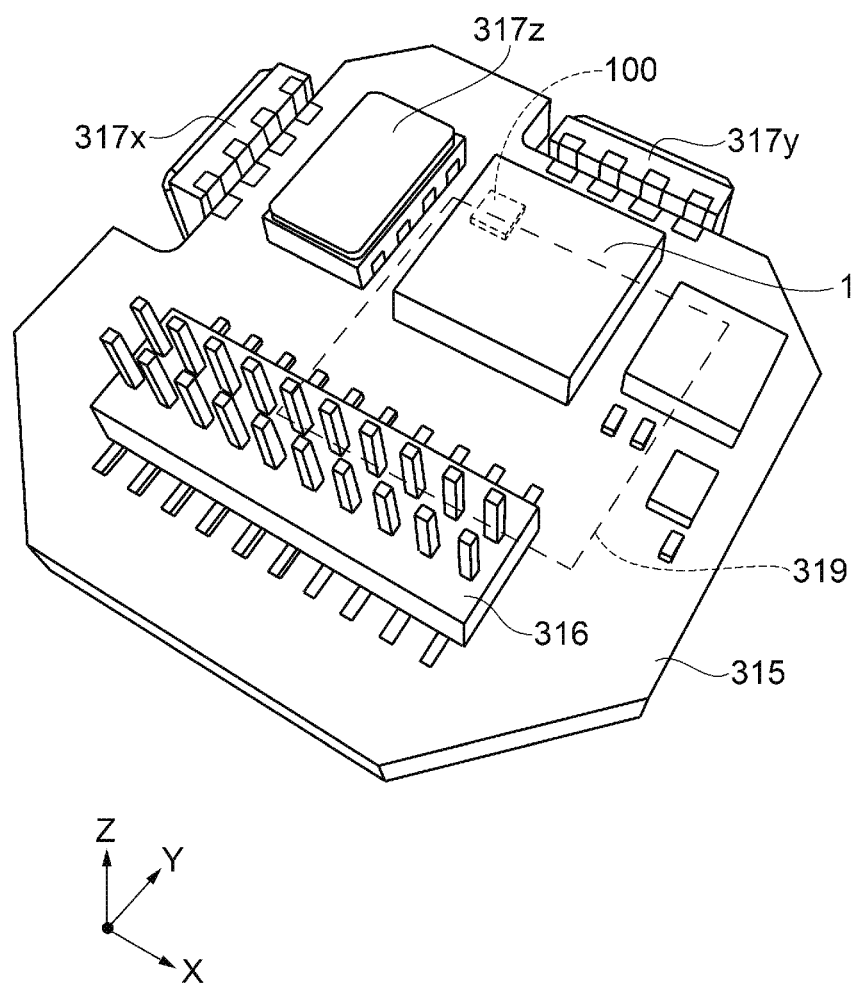
FIG. 17 is a perspective view showing an example of the arrangement of inertial sensor devices in the inertia measurement unit.

An inertia measurement unit (IMU) will next be described with reference to FIGS. 16 and 17. FIG. 16 is an exploded perspective view showing a schematic configuration of the inertia measurement unit. FIG. 17 is a perspective view showing an example of the arrangement of inertial sensor devices in the inertia measurement unit. The following description will be made with reference to the case where the physical quantity sensor 100 is used.

An inertia measurement unit 3000 is formed, for example, of an outer enclosure 301, a bonding member 310, and a sensor module 325 including inertia sensor devices, as shown in FIG. 16. In other words, the sensor module 352 is fit (inserted) in the interior 303 of the outer enclosure 301 with the bonding member 301 interposed between the sensor module 352 and the outer enclosure 301. The sensor module 325 is formed of an inner enclosure 320 and a substrate 315. The enclosures have been named the outer enclosure and the inner enclosure for ease of description and may instead be called a first enclosure and a second enclosure.

The outer enclosure 301 is a base mount made of aluminum machined into a box-like shape. The material of the outer enclosure 301 is not limited to aluminum and may instead be zinc, stainless steel, or any other metal, a resin, or a composite material containing a metal and a resin. The outer shape of the outer enclosure 301 is a rectangular parallelepiped having a roughly square plan shape, as is the overall shape of the inertia measurement unit 3000 described above, and through holes 302 are formed in the vicinity of two vertices of the square outer enclosure 301 that face each other along the diagonal direction of the square. The through holes 302 are not necessarily provided, and cutouts that allow screw fastening (structure in which cutouts are formed at corners of outer enclosure 301 where through holes 302 are located) may be formed to provide a screw fastening configuration. Still instead, a flange (thin peripheral portion) may be formed around the side surface of the outer enclosure 301, and the flange portion may be fastened with screws.

The outer enclosure 301 is a no-lid box having a rectangular parallelepiped outer shape, and the interior 303 of the outer enclosure 301 forms an inner space (container) surrounded by a bottom wall 305 and a side wall 304. In other words, the outer enclosure 301 has a box-like shape having one surface that is an open surface facing the bottom wall 305, and the sensor module 325 is so accommodated in the inner space as to almost completely occupy (close) the opening of the open surface with the sensor module 325 exposed through the opening (not shown). The open surface facing the bottom wall 305 coincides with an upper surface 307 of the outer enclosure 301. The plan shape of the interior 303 of the outer enclosure 301 is a hexagonal shape or a square shape with the corners of two vertex portions chamfered, and the two chamfered vertex portions correspond to the positions of the through holes 302. In the (thickness-direction) cross-sectional shape of the interior 303, a first bonding surface 306, which serves as a bottom wall one step higher than a central portion of the bottom wall 305, is formed in a peripheral portion of the bottom wall 305 in the interior 303, that is, the inner space. That is, the first bonding surface 306 is part of the bottom wall 305, is a single-stepped portion formed in a ring shape that surrounds the central portion of the bottom wall 305 in the plan view, and is a surface closer from the open surface (which coincides with upper surface 307) than from the bottom wall 305.

The case where the outer enclosure 301 is a no-lid box having a rectangular parallelepiped outer shape a roughly square plan shape has been described, but not necessarily, and the outer plan shape of the outer enclosure 301 may instead, for example, be a polygonal shape, such as a hexagonal shape and an octagonal shape. Further, the corners of the vertex portions of the polygonal shape may be chamfered, or the outer plan shape may have curved edges. Still instead, the plan shape of the interior 303 (inside) of the outer enclosure 301 is not limited to the hexagonal shape described above and may be a rectangular shape (quadrangular shape), such as a square, an octagonal shape, or any other polygonal shape. The outer shape of the outer enclosure 301 may or may not be similar to the plan shape of the interior 303.

The inner enclosure 320 is a member that supports the substrate 315 and has a shape that allows the inner enclosure 320 to be accommodated in the interior 303 of the outer enclosure 301. In detail, the inner enclosure 320 has a hexagonal plan shape or a square shape with corners of two vertex portions chamfered, and an opening 321, which is an oblong through hole, and a recess 331, which is provided in the surface that supports the substrate 315, are formed in the inner enclosure 320. The two chamfered vertex portions correspond to the positions of the through holes 302 of the outer enclosure 301. The height of the inner enclosure 320 in the thickness direction (Z-axis direction) is smaller than the height from the upper surface 307 to the first bonding surface 306 of the outer enclosure 301. In a preferable example, the inner enclosure 320 is also made of aluminum machined into the shape of the inner enclosure 320 but may instead be made of another material, as in the case of the outer enclosure 301.

A guide pin for positioning the substrate 315 and a support surface for supporting the substrate 315 (neither of them is shown) are formed on the rear surface of the inner enclosure 320 (surface facing outer enclosure 301). The substrate 315 is bonded to the rear surface of the inner enclosure 320 with the substrate 315 positioned by the guide pin and placed on the support surface (positioned and mounted). The substrate 315 will be described later in detail. A peripheral portion of the rear surface of the inner enclosure 320 forms a second bonding surface 322 formed of a ring-shaped flat surface. The second bonding surface 322 has a shape roughly similar to the shape of the first bonding surface 306 of the outer enclosure 301 in the plan view, and when the inner enclosure 320 is placed in the outer enclosure 301, the two bonding surfaces face each other with the bonding member 310 sandwiched therebetween. The structures of the outer enclosure 301 and the inner enclosure 320 have been presented byway of example and are not limited to those described above.

The configuration of the substrate 315 on which inertia sensors are mounted will be described with reference to FIG. 17. The substrate 315 is a multilayer substrate in which a plurality of through holes are formed and is formed of a glass-epoxy substrate, as shown in FIG. 17. The substrate 315 is, however, not limited to a glass-epoxy substrate and only needs to be a rigid substrate on which a plurality of inertial sensors, electronic parts, connectors, and other components are mountable. For example, a composite substrate or a ceramic substrate may be used.

A connector 316, an angular velocity sensor 317z, an acceleration detection unit 1 including the physical quantity sensor 100, which is an acceleration sensor for measuring acceleration in the Z-axis direction described above, and other components are mounted on a front surface of the substrate 315 (surface facing inner enclosure 320). The connector 316 is a plug-type (male) connector and includes two-row connection terminals arranged at equal intervals in the Z-axis direction. The connection terminals are preferably 10 pins per row, 20 pins in total, but the number of terminals may be changed as appropriate in accordance with design specifications.

The angular velocity sensor 317z as an inertia sensor is a gyro sensor that detects uniaxial angular velocity in the Z-axis direction. The angular velocity sensor 317z is preferably a vibration gyro sensor that uses quartz as the vibrator and detects angular velocity from Coriolis force acting on a vibrating object. The angular velocity sensor 317z is not limited to a vibration gyro sensor and only needs to be a sensor capable of detecting angular velocity. For example, a sensor made of a ceramic material or silicon may be used as the vibrator.

An angular velocity sensor 317x, which detects uniaxial angular velocity in the X-axis direction, is mounted on the X-axis-direction side surface of the substrate 315 in such a way that the surface on which the angular velocity sensor 317x is mounted (implemented) is perpendicular to the axis X. Similarly, an angular velocity sensor 317y, which detects uniaxial angular velocity in the Y-axis direction, is mounted on the Y-axis-direction side surface of the substrate 315 in such a way that the surface on which the angular velocity sensor 317y is mounted (implemented) is perpendicular to the axis Y.

The angular velocity sensors 317x, 317y, and 317z are not limited to three angular velocity sensors for the respective axes X, Y, and Z and only need to be sensors capable of detecting angular velocity in each of the three axes. For example, a single sensor device (package) capable of detecting (sensing) angular velocity in each of the three axes may be used.

The acceleration detection unit 1 includes at least the physical quantity sensor 100 described above, which is an acceleration sensor for measuring acceleration in the Z-axis direction, and can detect as required acceleration in one axial direction (Z-axis direction, for example), acceleration in two axial directions (axes Z and Y or axes X and Y, for example) or acceleration in each of the three axial directions (axes X, Y, and Z).

A control IC 319 as a controller is mounted on the rear surface of the substrate 315 (surface facing outer enclosure 301). The control IC 319 is a microcontroller unit (MCU), incorporates a storage including a nonvolatile memory, an A/D converter, and other components, and controls each portion of the inertia measurement unit 3000. The storage stores a program that defines the order and content for detecting acceleration and angular velocity, a program that digitizes detected data and incorporates the data into packet data, data associated with the programs, and other pieces of information. A plurality of other electronic parts are mounted on the substrate 315.

The thus configured inertia measurement unit 3000, which uses the acceleration detection unit 1 including the physical quantity sensor 100, can be an inertia measurement unit 3000 that excels in impact resistance and has improved reliability.

Portable Electronic Apparatus

A portable electronic apparatus using either of the physical quantity sensors 100 and 200 will next be described in detail with reference to FIGS. 18 and 19. The following description will be made with reference to the case where the physical quantity sensor 100 is used. In the following description, a wristwatch-shaped activity tracker will be described as an example of the portable electronic apparatus.

Figure 18:
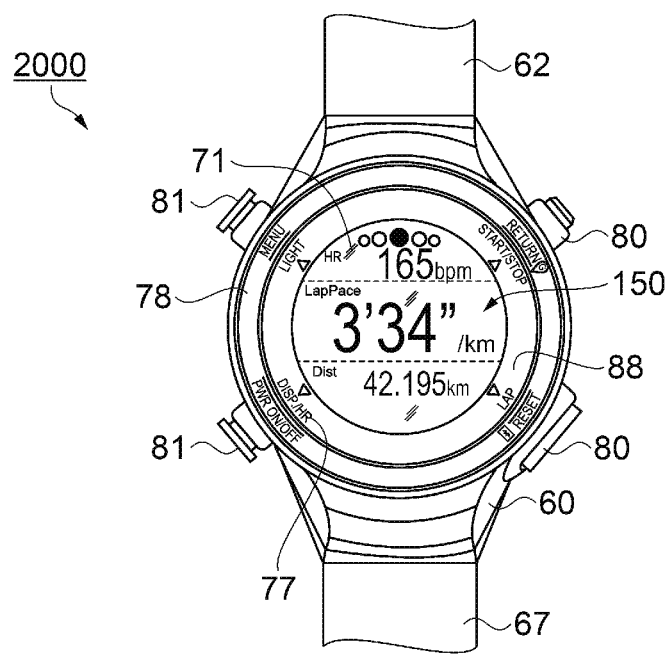
FIG. 18 is a plan view diagrammatically showing the configuration of a portable electronic apparatus.
Figure 19:
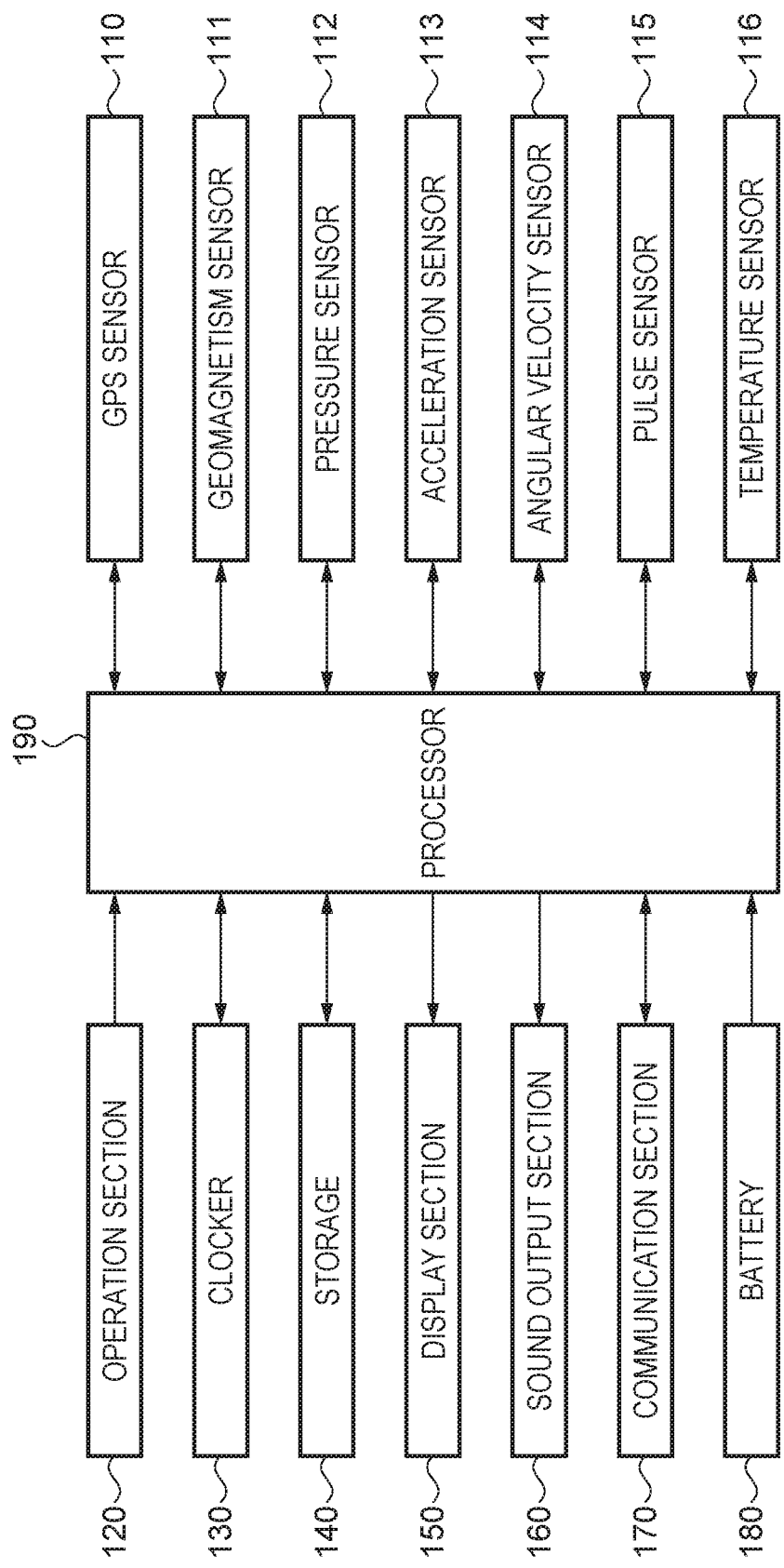
FIG. 19 is a functional block diagram showing a schematic configuration of the portable electronic apparatus.

A wristwatch apparatus 2000, which is a wristwatch-shaped activity tracker, is worn on a portion (subject) of a user, such as a wrist, with the aid of bands 62 and 67 and other components, includes a digital display section 150 as shown in FIG. 18, and can perform wireless communication. The physical quantity sensor 100 described above according to the embodiment of the invention is incorporated as one of sensors that measure acceleration and sensors that measure angular velocity in the wristwatch apparatus 2000.

The wristwatch apparatus 2000 includes an enclosure 60, which accommodates at least the physical quantity sensor 100, a processor 190 (see FIG. 19), which is accommodated in the enclosure 60 and processes data outputted from the physical quantity sensor 100, the display section 150, which is accommodated in the enclosure 60, and a light transmissive cover 71, which closes an opening of the enclosure 60. A bezel 78 is provided around the outer circumference of the light transmissive cover 71 of the enclosure 60. A plurality of operation buttons 80 and 81 are provided on the side surface of the enclosure 60. The wristwatch apparatus 2000 will be described in more detail below with reference also to FIG. 19.

An acceleration sensor 113 contained in the physical quantity sensor 100 detects acceleration in each of the three axial directions that intersect one another (ideally perpendicular to one another) and outputs a signal according to the magnitude and orientation of the detected acceleration in each of the three axes (acceleration signal). An angular velocity sensor 114 detects angular velocity in each of the three axial directions that intersect one another (ideally perpendicular to one another) and outputs a signal according to the magnitude and orientation of the detected angular velocity in each of the three axes (angular velocity signal).

A liquid crystal display (LCD) that forms the display section 150 displays, for example, position information acquired by using a GPS sensor 110 and a geomagnetism sensor 111, motion information, such as the amount of movement and the amount of motion acquired by using the acceleration sensor 113 contained in the physical quantity sensor 100, the angular velocity sensor 114, or any other sensor, biological information, such as the pulse rate acquired by using a pulse sensor 115 or any other sensor, or time information, such as current time according to a variety of detection modes. The display section 150 can also display an environment temperature acquired by using a temperature sensor 116.

A communication section 170 performs a variety of types of control for establishing communication between a user terminal and an information terminal that is not shown. The communication section 170 includes a transceiver that complies with Bluetooth (registered trademark) (including Bluetooth Low Energy: BILE), Wi-Fi (registered trademark) (wireless fidelity), Zigbee (registered trademark), NFC (near field communication), ANT+ (registered trademark), or any other short-range wireless communication standard and a connector that complies with USB (universal serial bus) or any other communication bus standard.

The processor 190 is formed, for example, of a microprocessing unit (MPU), a digital signal processor (DSP), or an application specific integrated circuit (ASIC). The processor 190 carries out a variety of processes based on the programs stored in the storage 140 and a signal inputted from an operation section 120 (operation buttons 80 and 81, for example). The processes carried out by the processor 190 include data processing performed on output signals from the GPS sensor 110, the geomagnetism sensor 111, a pressure sensor 112, the acceleration sensor 113, the angular velocity sensor 114, the pulse sensor 115, the temperature sensor 116, and a time clocker 130, a display process of causing the display section 150 to display an image, a sound output process of causing a sound output section 160 to output sound, a communication process of performing communication with the information terminal (not shown) via the communication section 170, and an electric power control process of supplying electric power from a battery 180 to each portion of the wristwatch apparatus 2000.

The thus configured wristwatch apparatus 2000 can function at least as follows.

1. Distance: The total distance from the start of measurement is measured with the aid of a high-precision GPS function.

2. Pace: The current travel pace is displayed based on pace/distance measurement.

3. Average speed: The average of the speed at the start of average-speed travel to the speed at the current time is calculated and displayed.

4. Altitude: The altitude is measured with the aid of the GPS function and displayed.

5. Stride: The stride is measured and displayed, for example, even in a tunnel, which no GPS electric wave enters.

6. Pitch: The number of steps per minute is measured and calculated.

7. Pulse rate: The pulse rate is measured with the pulse sensor and displayed.

8. Gradient: The gradient of the ground is measured and displayed in training or trail running in a mountainous area.

9. Automatic lap time: When a wearer runs over a fixed distance or for a fixed period set in advance, the lap time is automatically measured.

10. Calorie consumed in activity: Consumed calorie is displayed.

11. Number of steps: The total number of steps measured from the start of activity is displayed.

The wristwatch apparatus 2000 can be widely used, for example, as a running watch, a runner's watch, a runner's watch that can be used in duathlon, triathlon, and other multi-sport, an outdoor watch, and a GPS watch incorporating a satellite positioning system, for example, a GPS.

In the embodiment described above, a GPS (Global Positioning System) is used as a satellite positioning system, and any other global navigation satellite system (GNSS) may instead be used. For example, one of or two or more of EGNOS (European Geostationary-Satellite Navigation Overlay Service), QZSS (Quasi Zenith Satellite System), GLONASS (GLObal NAvigation Satellite System), GALILEO, BeiDou (BeiDou Navigation Satellite System), and other satellite positioning systems may be used. Further, WAAS (Wide Area Augmentation System), EGNOS (European Geostationary-Satellite Navigation Overlay Service), or any other satellite-based augmentation system (SBAS) may be used as at least one of the satellite positioning systems.

The thus configured portable electronic apparatus (wristwatch apparatus 2000), which includes the physical quantity sensor 100 and the processor 190, has excellent reliability, such as impact resistance.

Electronic Apparatus

An electronic apparatus including either of the physical quantity sensors 100 and 200 according to the embodiment of the invention will next be described with reference to FIGS. 20 to 22. The following description will be made with reference to the case where the physical quantity sensor 100 is used.

Figure 20:
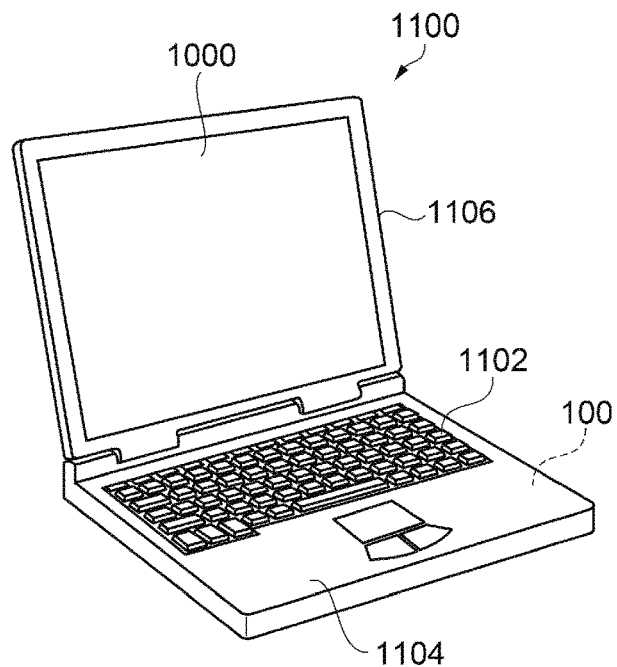
FIG. 20 is a perspective view showing a schematic configuration of a mobile (or notebook) personal computer as an electronic apparatus including the physical quantity sensor.

FIG. 20 is a perspective view showing a schematic configuration of a mobile (or notebook) personal computer as the electronic apparatus including the physical quantity sensor according to the embodiment of the invention. In FIG. 20, a personal computer 1100 is formed of a main body 1104 including a keyboard 1102 and a display unit 1106 including a display section 1000, and the display unit 1106 is swingably supported by the main body 1104 via a hinge structure. The thus configured personal computer 1100 accommodates the physical quantity sensor 100, which functions as, for example, an acceleration sensor, and a controller (not shown) can perform attitude control or any other type of control based on a detection signal from the physical quantity sensor 100.

Figure 21:
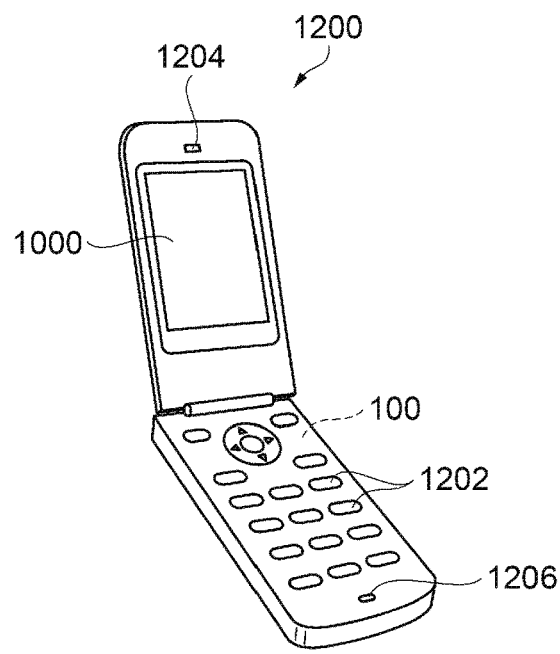
FIG. 21 is a perspective view showing a schematic configuration of a mobile phone (including PHS) as the electronic apparatus including the physical quantity sensor.

FIG. 21 is a perspective view showing a schematic configuration of a mobile phone (including PHS) as the electronic apparatus including the physical quantity sensor according to the embodiment of the invention. In FIG. 21, a mobile phone 1200 includes a plurality of operation buttons 1202, a receiver 1204, and a transmitter 1206, and a display section 1000 is disposed between the operation buttons 1202 and the receiver 1204. The thus configured mobile phone 1200 accommodates the physical quantity sensor 100, which functions as, for example, an acceleration sensor, and a controller (not shown) can recognize, for example, the attitude or behavior of the mobile phone 1200 to change an image displayed on the display section 1000, issue alarm sound or effect sound, or drive a vibration motor to vibrate the main body based on a detection signal from the physical quantity sensor 100.

Figure 22:
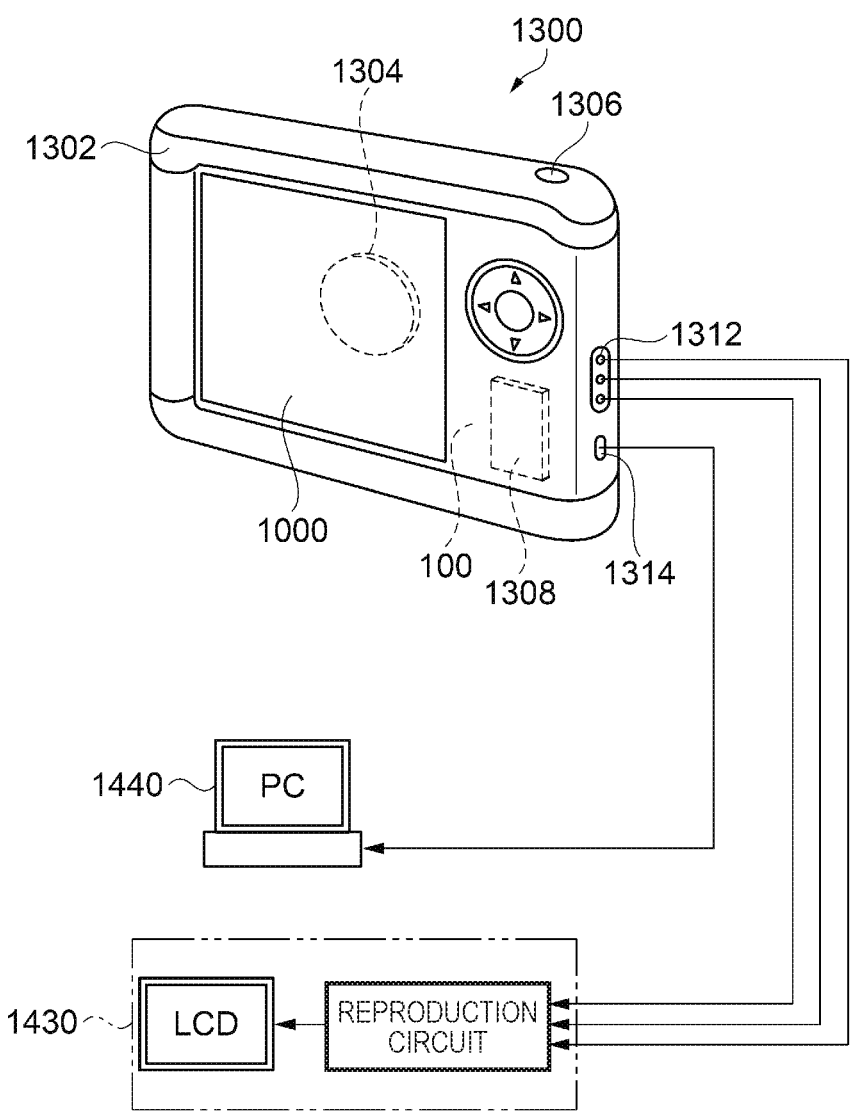
FIG. 22 is a perspective view showing a schematic configuration of a digital still camera as the electronic apparatus including the physical quantity sensor.

FIG. 22 is a perspective view showing a schematic configuration of a digital still camera as the electronic apparatus including the physical quantity sensor according to the embodiment of the invention. FIG. 22 also shows connection to an external apparatus in a simplified manner. In a film camera of related art, a silver photographic film is exposed to light, specifically, to an optical image of a subject, whereas a digital still camera 1300 converts an optical image of a subject into a captured image signal (image signal) in a photoelectric conversion process by using a charge coupled device (CCD) or any other imaging device.

A display section 1000 is provided on the rear side of an enclosure (body) 1302 of the digital still camera 1300 and displays an image based on the captured image signal from the CCD. The display section 1000 thus functions as a finder that displays the subject in the form of an electronic image. Further, a light receiving unit 1304 including an optical lens (imaging system), the CCD, and other components is provided on the front side (rear side in FIG. 22) of the enclosure 1302.

When a user of the camera checks the subject image displayed on the display section 1000 and presses a shutter button 1306, a captured image signal from the CCD at that point of time is transferred to and stored in a memory 1308. Further, in the digital still camera 1300, a video signal output terminal 1312 and a data communication input/output terminal 1314 are provided on a side surface of the enclosure 1302. A television monitor 1430 is connected to the video signal output terminal 1312 as necessary, and a personal computer 1440 is connected to the data communication input/output terminal 1314 as necessary, as shown in FIG. 22. Further, in response to predetermined operation, the captured image signal stored in the memory 1308 is outputted to the television monitor 1430 or the personal computer 1440. The thus configured digital still camera 1300 accommodates the physical quantity sensor 100, which functions as, for example, an acceleration sensor, and a controller (not shown) can perform hand-shake correction or any other type of control based on a detection signal from the physical quantity sensor 100.

The electronic apparatus 1100, 1200, and 1300 described above each include the physical quantity sensor 100 capable of improving reliability and detection sensitivity. The electronic apparatus 1100, 1200, and 1300 are allowed to have high reliability and detection sensitivity.

The physical quantity sensor 100 according to the embodiment of the invention is used not only in the personal computer 1100 (mobile personal computer) shown in FIG. 20, the mobile phone 1200 shown in FIG. 21, and the digital still camera 1300 shown in FIG. 22 but also, for example in a variety of other electronic apparatus, such as an inkjet-type liquid ejection apparatus (inkjet printer, for example), a laptop personal computer, a television receiver, a video camcorder, a video tape recorder, a car navigator, a pager, an electronic notepad (including electronic notepad having communication capability), an electronic dictionary, a desktop calculator, an electronic game console, a word processor, a workstation, a TV phone, a security television monitor, electronic binoculars, a POS terminal, a medical apparatus (such as electronic thermometer, blood pressure gauge, blood sugar meter, electrocardiograph, ultrasonic diagnostic apparatus, and electronic endoscope), a fish finder, a variety of measuring apparatus, a variety of instruments (such as instruments in vehicles, airplanes, and ships), and a flight simulator.

Vehicle

A vehicle including either of the physical quantity sensor 100 and 200 according to the embodiment of the invention will next be described with reference to FIG. 23. The following description will be made with reference to the case where the physical quantity sensor 100 is used.

Figure 23:
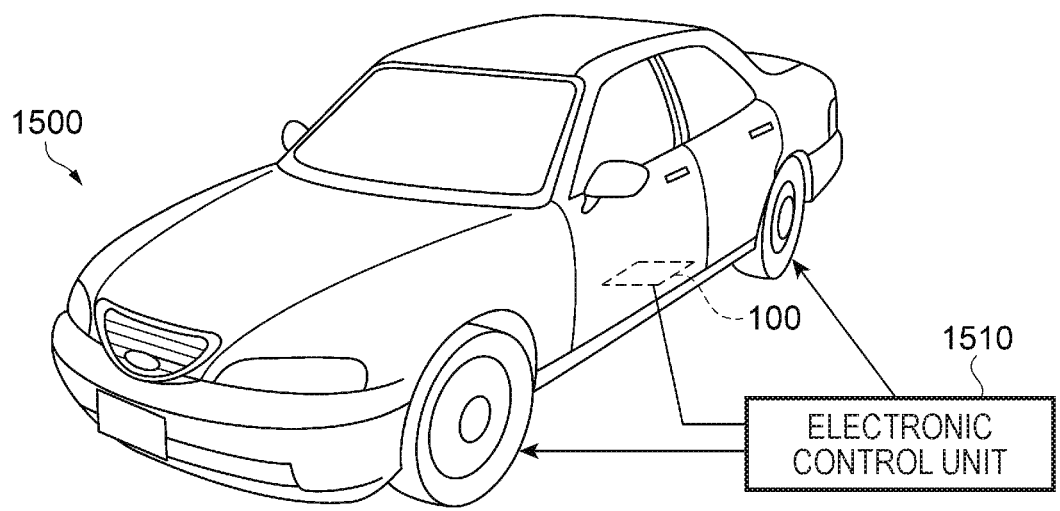
FIG. 23 is a perspective view schematically showing an automobile as a vehicle including the physical quantity sensor.

FIG. 23 is a perspective view schematically showing an automobile as a vehicle including the physical quantity sensor according to the embodiment of the invention. An automobile 1500 accommodates the physical quantity sensor 100 according to the embodiment. For example, the automobile 1500 as a vehicle accommodates an electronic control unit 1510, which serves as a controller that accommodates the physical quantity sensor 100 and controls the wheels or any other part, in a vehicle body, as shown in FIG. 23. In addition, the physical quantity sensor 100 can be widely used as a keyless entry system, an immobilizer, a car navigation system, a car air conditioner, an antilock brake system (ABS), an airbag, a tire pressure monitoring system (TPMS), an engine control system, an apparatus that monitors a battery in a hybrid automobile and an electric automobile, a vehicle body attitude control system, and other electronic control units (ECUs).

The entire disclosure of Japanese Patent Application No. 2017-165161 filed Aug. 30, 2017 is expressly incorporated herein by reference.

What is claimed is:

1. A physical quantity sensor comprising:
three axes orthogonal to each other being defined as an X axis, a Y axis, and a Z axis; a support substrate having a columnar post upstanding therefrom along the Z axis;
a movable plate extending along the X axis and Y axis, the movable plate being swingably supported by the columnar post, the movable plate being spaced apart from the support substrate by a gap, the movable plate being swingable around a rotation axis extending along the Y axis, the movable plate having a plurality of through holes, each of the plurality of through holes penetrating the movable plate along the Z axis, the plurality of through holes being spaced apart from each other by a same distance along the X axis and the Y axis; and
a protrusion protruding from the support substrate toward the movable plate, a tip of the protrusion being spaced apart from a bottom of the movable plate in a balanced state of the movable plate, an entirety of the protrusion being overlapped with an overlap area of the movable plate along the Z axis,
wherein the overlap area of the movable plate has a first diameter equal to a maximum diametrical dimension of the protrusion,
an imaginary largest circle drawable in a hole free area of the movable plate has a second diameter and has the same center as the first diameter, and the second diameter is twice the first diameter, and
the hole free area of the movable plate is free from any one of the plurality of through holes, and at least three-fourths of a periphery of the hole free area is surrounded by adjacent through holes of the plurality of through holes.

2. The physical quantity sensor according to claim 1, further comprising:
a plurality of other protrusions protruding from the support substrate toward the movable plate, a tip of each of the plurality of other protrusions being spaced apart from the bottom of the movable plate in the balanced state of the movable plate,
wherein the movable plate has a plurality of other hole free areas, and each of the plurality of other hole free areas is free from any one of the plurality of through holes,
the tips of the plurality of other protrusions align with the plurality of other hole free areas, respectively, in the balanced state of the movable plate along the Z-axis, and
a number of the plurality of other protrusions is the same as a number of the plurality of other hole free areas.

3. The physical quantity sensor according to claim 2, wherein the protrusion and the plurality of other protrusions are located symmetrically with respect to the rotation axis of the movable plate.

4. The physical quantity sensor according to claim 1, wherein a distance along the X axis between the rotation axis of the movable plate and the protrusion is less than or equal to half of a distance along the X axis between the rotation axis of the movable plate and an end edge of the movable plate.

5. A physical quantity sensor comprising:
three axes orthogonal to each other being defined as an X axis, a Y axis, and a Z axis;
a support substrate having first and second areas that are formed by dividing an entirety of the support substrate with respect to a dividing line extending along the Y axis;
a post upstanding from the support substrate along the Z axis;
a movable plate extending along the X axis and Y axis, the movable plate being swingably supported by the post, the movable plate being spaced apart from the support substrate by a gap, the movable plate being swingable around a rotation axis extending along the Y axis, the movable plate having a plurality of through holes, each of the plurality of through holes penetrating the movable plate along the Z axis, the plurality of through holes being spaced apart from each other by a same distance along the X axis and the Y axis, the movable plate being divided into a first plate area and a second plate area with respect to the rotation axis, the first and second plate areas facing the first and second areas of the support substrate along the Z axis;
a first protrusion upstanding from the first area of the support substrate, a first tip of the first protrusion being spaced apart from a bottom of the first plate area of the movable plate in a balanced state of the movable plate;

a second protrusion upstanding from the second area of the support substrate, a second tip of the second protrusion being spaced apart from a bottom of the second plate area of the movable plate in the balanced state of the movable plate, wherein the movable plate in the first plate area includes a first hole free area, and the first hole free area of the movable plate is free from any one of the plurality of through holes, an area of the first hole free area of the movable plate is larger than an area of the first tip of the first protrusion, and the first hole free area of the movable plate is configured to abut the first tip of the first protrusion in an unbalanced state of the movable plate, the movable plate in the second plate area includes a second hole free area, and the second hole free area of the movable plate is free from any one of the plurality of through holes, an area of the second hole free area of the movable plate is larger than an area of the second tip of the second protrusion, and the second hole free area of the movable plate is configured to abut the second tip of the second protrusion in the unbalanced state of the movable plate, and each of at least three-fourths of peripheries of the first and second hole free areas is surrounded by adjacent through holes of the plurality of through holes.

6. The physical quantity sensor according to claim 5, wherein the post is columnar-shaped.

7. The physical quantity sensor according to claim 6, a diameter of an imaginary largest circle drawable in the first hole free area of the movable plate is twice the diameter of the first tip of the first protrusion, and a diameter of an imaginary largest circle drawable in the second hole free area of the movable plate is twice a diameter of the second tip of the second protrusion.

8. The physical quantity sensor according to claim 7, wherein the diameter of the first tip of the first protrusion is substantially equal to the diameter of the second tip of the second protrusion.

9. The physical quantity sensor according to claim 5, wherein the first and second protrusions are cylindrical-shaped.

10. The physical quantity sensor according to claim 5, wherein each of the plurality of through holes is square-shaped along the Z axis.

11. The physical quantity sensor according to claim 5, wherein the first and second protrusions are located symmetrically with respect to the rotation axis of the movable plate.

12. The physical quantity sensor according to claim 11, further comprising:
    a third protrusion upstanding from the first area of the support substrate, a third tip of the third protrusion being spaced apart from the bottom of the first plate area of the movable plate in the balanced state of the movable plate; and
    a fourth protrusion upstanding from the second area of the support substrate, a fourth tip of the fourth protrusion being spaced apart from the bottom of the second plate area of the movable plate in the balanced state of the movable plate,
    wherein the first and third protrusions are located symmetrically with respect to an imaginary center line along the X axis, and the imaginary center line passes a center of the rotation axis along the Y axis, and
    the second and fourth protrusions are located symmetrically with respect to the imaginary center line.

13. The physical quantity sensor according to claim 5, further comprising:
    a third protrusion upstanding from the first area of the support substrate, a third tip of the third protrusion being spaced apart from the bottom of the first plate area of the movable plate in the balanced state of the movable plate; and
    a fourth protrusion upstanding from the second area of the support substrate, a fourth tip of the fourth protrusion being spaced apart from the bottom of the second plate area of the movable plate in the balanced state of the movable plate,
    wherein the first and third protrusions are located symmetrically with respect to an imaginary center line along the X axis, and the imaginary center line passes a center of the rotation axis along the Y axis, and
    the second and fourth protrusions are located symmetrically with respect to the imaginary center line.

14. The physical quantity sensor according to claim 5, wherein a distance along the X axis between the rotation axis of the movable plate and the first protrusion is less than or equal to half of a distance along the X axis between the rotation axis of the movable plate and an end edge of the movable plate.

\* \* \* \* \*